United States Patent
Liaw

(10) Patent No.: US 11,094,700 B2
(45) Date of Patent: Aug. 17, 2021

(54) WELL STRAP STRUCTURES AND METHODS OF FORMING THE SAME

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/121,562

(22) Filed: Dec. 14, 2020

(65) Prior Publication Data

US 2021/0098474 A1 Apr. 1, 2021

Related U.S. Application Data

(63) Continuation of application No. 16/433,540, filed on Jun. 6, 2019, now Pat. No. 10,868,020.

(60) Provisional application No. 62/724,471, filed on Aug. 29, 2018.

(51) Int. Cl.
| | |
|---|---|
| *H01L 27/11* | (2006.01) |
| *G11C 11/412* | (2006.01) |
| *H01L 27/12* | (2006.01) |
| *H01L 27/02* | (2006.01) |
| *H01L 21/84* | (2006.01) |

(52) U.S. Cl.
CPC ........ *H01L 27/1108* (2013.01); *G11C 11/412* (2013.01); *H01L 21/845* (2013.01); *H01L 27/0207* (2013.01); *H01L 27/1211* (2013.01)

(58) Field of Classification Search
CPC ............. H01L 27/1108; H01L 27/1211; H01L 27/0207; H01L 21/845; G11C 11/412
See application file for complete search history.

(56) References Cited

U.S. PATENT DOCUMENTS

| | | | |
|---|---|---|---|
| 6,927,442 B2 | 8/2005 | Kaneko et al. | |
| 7,075,133 B1 | 7/2006 | Padmanabhan et al. | |
| 7,586,147 B2 | 9/2009 | Liaw et al. | |
| 7,906,389 B2 | 3/2011 | Liaw et al. | |
| 8,772,109 B2 | 7/2014 | Colinge et al. | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |

(Continued)

*Primary Examiner* — Ajay Ojha
(74) *Attorney, Agent, or Firm* — Haynes and Boone, LLP

(57) ABSTRACT

An integrated circuit structure includes: a well region having a first conductivity type; a semiconductor structure extending away from the well region from a major surface of the well region, the semiconductor structure having the first conductivity type; a source/drain feature disposed on the semiconductor structure, the source/drain feature having a second conductivity type different from the first conductivity type; an isolation layer laterally surrounding at least a portion of the semiconductor structure; a dielectric layer disposed on the isolation layer, where at least a portion of the source/drain feature is disposed in the dielectric layer; and a conductive plug continuously extending through the dielectric layer and the isolation layer to physically contact the major surface of the well region, wherein the conductive plug is coupled to a power supply line to bias the well region.

20 Claims, 25 Drawing Sheets

(56) References Cited

U.S. PATENT DOCUMENTS

| | | |
|---|---|---|
| 9,236,300 B2 | 1/2016 | Liaw et al. |
| 9,520,482 B1 | 12/2016 | Chang et al. |
| 9,576,814 B2 | 2/2017 | Wu et al. |
| 9,613,953 B2 | 4/2017 | Liaw et al. |
| 9,793,273 B2 | 10/2017 | Liaw et al. |
| 9,805,985 B2 | 10/2017 | Liaw et al. |
| 10,038,058 B2 | 7/2018 | Voldman et al. |
| 10,128,113 B2 | 11/2018 | Chou et al. |
| 2008/0142899 A1 | 6/2008 | Morris et al. |

WELL STRAP STRUCTURES AND METHODS OF FORMING THE SAME

PRIORITY DATA

This application is a Continuation of U.S. patent application Ser. No. 16/433,540, filed Jun. 6, 2019, which further claims priority to U.S. Provisional Patent Application Ser. No. 62/724,471 filed Aug. 29, 2018. The entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component, or line, that can be created using a fabrication process) has decreased.

This scaling down process generally provides benefits by increasing production efficiency and lowering associated costs. However, the scaling down process has also increased the complexity of processing and manufacturing ICs. For example, the scaling down process has led to increased pick-up resistance and reduced latch-up performance (e.g. degraded latch-up immunity) in well strap cells. Accordingly, although existing well strap cells have been generally adequate for their intended purposes, they have not been entirely satisfactory in all respects. Further improvements in well strap cells may be needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
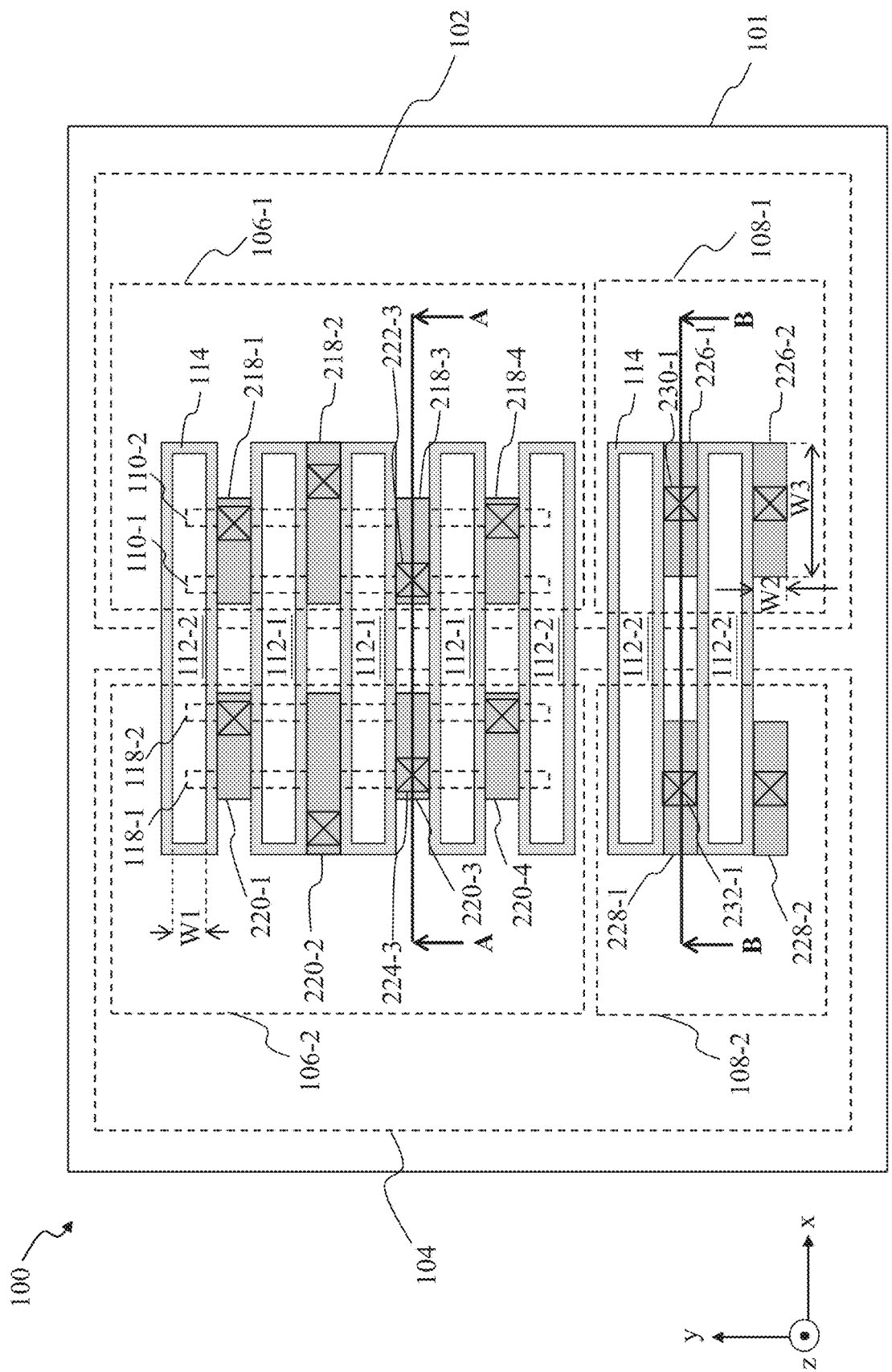
FIGS. 1, 3, and 4 show simplified top-down schematic views of integrated circuits, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

For advanced IC technology nodes, non-planar transistors (e.g. fin-like field effect transistors (FinFETs) or gate-all-around-like (GAA) FETs) have become a popular and promising candidate for high performance and low leakage applications. Logic circuits and memory arrays (such as static random access memory (SRAM) arrays) often incorporate non-planar transistors to enhance performance. The performance of logic circuits and memory cells is largely layout dependent. For example, it has been observed that an inner memory cell of a memory array performs differently than an edge memory cell of the memory array. In some layouts, inner memory cells and edge memory cells exhibit different threshold voltages ($V_t$), different on-currents ($I_{on}$), and/or different off-currents ($I_{off}$).

A well strap (also referred to as an electrical tie) electrically connects a well region corresponding with a transistor (e.g. of a logic circuit or a memory cell) to a voltage node (or voltage line). For example, a fin-based n-type well strap electrically connects an n-well region corresponding with a p-type FinFET to a voltage node, such as a voltage node associated with the p-type transistor, while a fin-based p-type well strap electrically connects a p-well region corresponding with an n-type FinFET to a voltage node, such as a voltage node associated with the n-type transistor. Well straps have thus been implemented to stabilize well potential and facilitate uniform charge distribution throughout a logic circuit or a memory array, thereby allowing for uniform performance among components of a logic circuit or among memory cells of the memory array.

However, as smaller technology nodes (for example, 20 nm, 16 nm, 10 nm, 7 nm, and below) are introduced, decreasing the dimension and pitch of non-planar transistors in a well strap has diminished benefits provided by such transistors and well straps. For example, in a fin-based well strap, decreasing fin widths has been observed to increase well pick-up resistance, such that well pick-up resistance of a fin-based well strap is higher than the well pick-up resistance of a planar-based well strap. Such increases in well pick-up resistance degrades latch-up performance (e.g. degrades latch-up immunity) of memory arrays using fin-based well straps. It is noted that the degradation in latch-up performance and the increase in well pick-up resistance is also observed in well straps based on other non-planar-type transistors (e.g. GAA transistors).

In addition to degraded latch-up performance and increased well pick-up resistance, typical well straps may include a source/drain structure that has a conductivity-type that is opposite to the source/drain structure of its corresponding transistor. For example, an n-type well strap may include an n-type semiconductor structure to electrically connect an n-well region corresponding with a p-doped source/drain structure of a p-type FinFET to a voltage node, while a p-type well strap may include a p-type semiconductor structure to electrically connect a p-well region corresponding with an n-doped source/drain structure of an n-type FinFET to a voltage node. This difference in the conductivity-type of the source/drain structures of a transistor and the semiconductor structure of its corresponding well strap requires anti-type source/drain doping to appropriately dope the source/drain structure of a transistor and the semiconductor structure of its corresponding well strap. This anti-type source/drain doping negatively impacts the size of a well pick-up region and increases the complexity of a lithography/patterning step for n+ doping of the source/drain structures of an n-type transistor and p+ doping of the source/drain structures of a p-type transistor.

In view of the challenges described above, the present disclosure proposes well straps that have reduced well pick-up resistance, achieve significant improvements in latch-up performance, and efficiently use chip real estate. For example, this disclosure proposes using a conductive plug (e.g. a metal plug) that extends fully through an isolation layer (e.g. shallow trench isolation layer) to physically contact a major surface of a well region so that well pick-up resistance is reduced and latch-up immunity is improved (e.g., in a logic circuit or a memory array including the proposed well strap). Contact between the conductive plug and the well region is made without the use of an intervening semiconductor structure (e.g. a fin) that extends from the major surface of the well region. In some embodiments, a silicide layer is formed in the well region and the conductive plug physically contacts the silicide layer formed in the well region. Additionally, since contact between the conductive plug and the well region is made without the use of an intervening semiconductor structure that extends from the major surface of the well region, no anti-type source/drain masking step is required for doping a well pick-up region. Furthermore, since contact between the conductive plug and the well region is made without the use of an intervening semiconductor structure that extends from the major surface of the well region, a well pick-up region can be separated from a circuit region by a single dummy gate (e.g. dielectric dummy gate) having a width substantially equal to a channel length (e.g. 2 nanometers to 30 nanometers). This obviates the need for a substantial dummy region/area between a circuit region and a well pick-up region, which, in turn, results in a more efficient use of chip area. The proposed well strap may be used in conjunction with fin-based logic circuit or memory cells or GAA-based logic circuits or memory cells. Furthermore, the proposed well strap does not affect desired characteristics of non-planar transistors used in memory cells (e.g. voltage threshold in a FinFET used in a memory cells). Different embodiments may have different advantages, and no particular advantage is necessarily required of any embodiment.

Figure 2A:
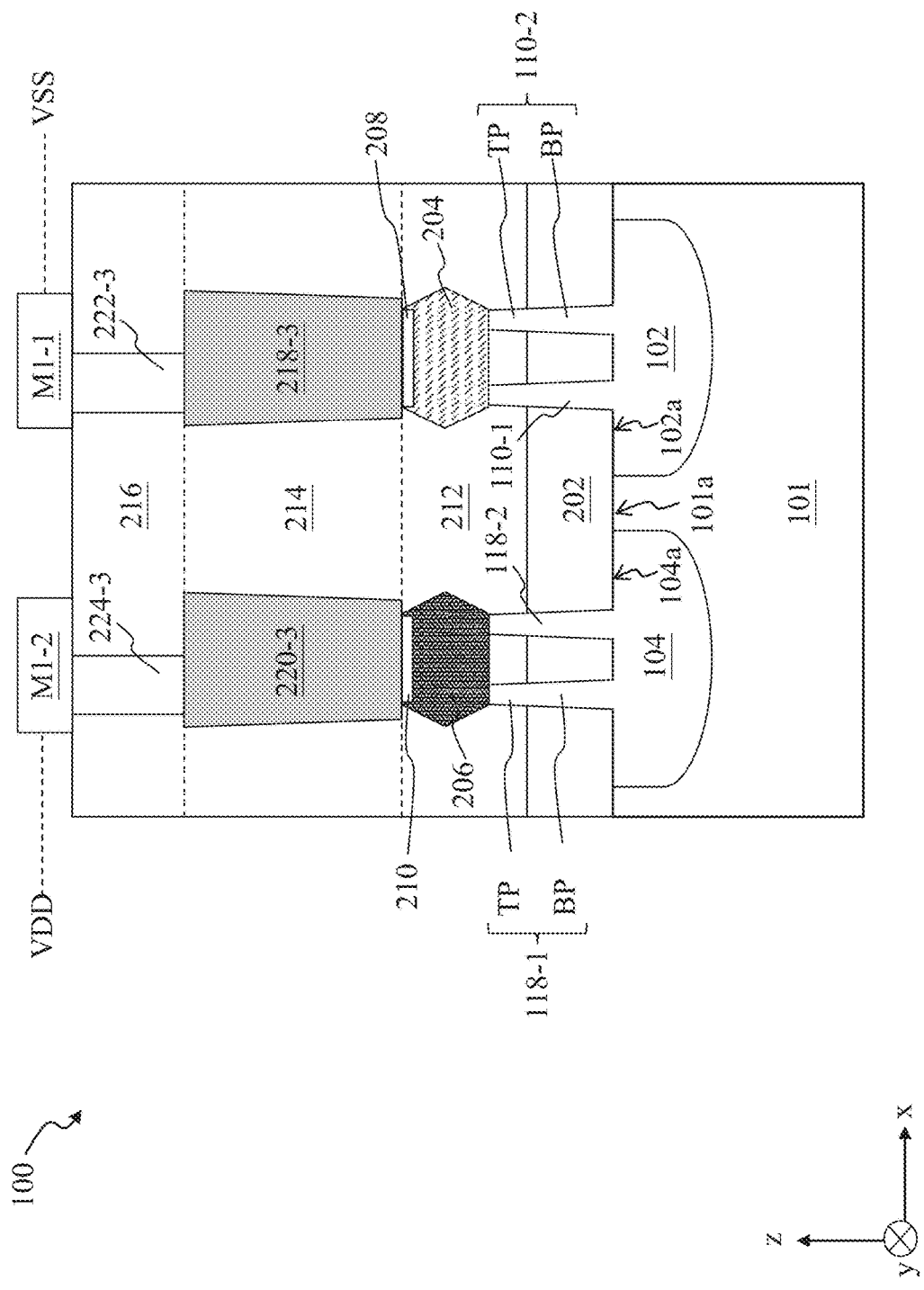
FIGS. 2A to 2E show simplified cross-sectional views of the schematic top-down views shown in FIGS. 1, 3, and 4, in accordance with various embodiments.
Figure 2B:
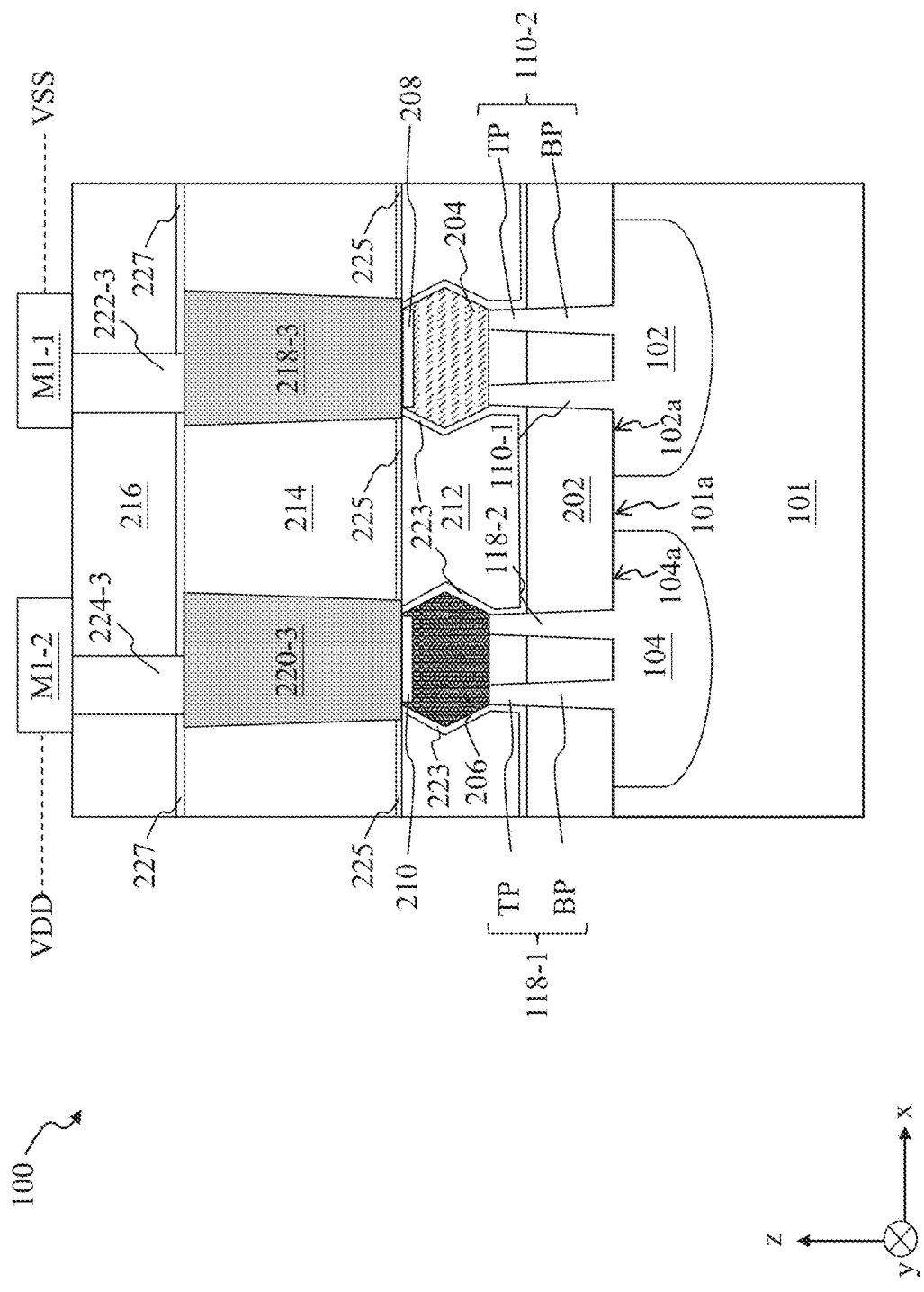
Figure 2C:
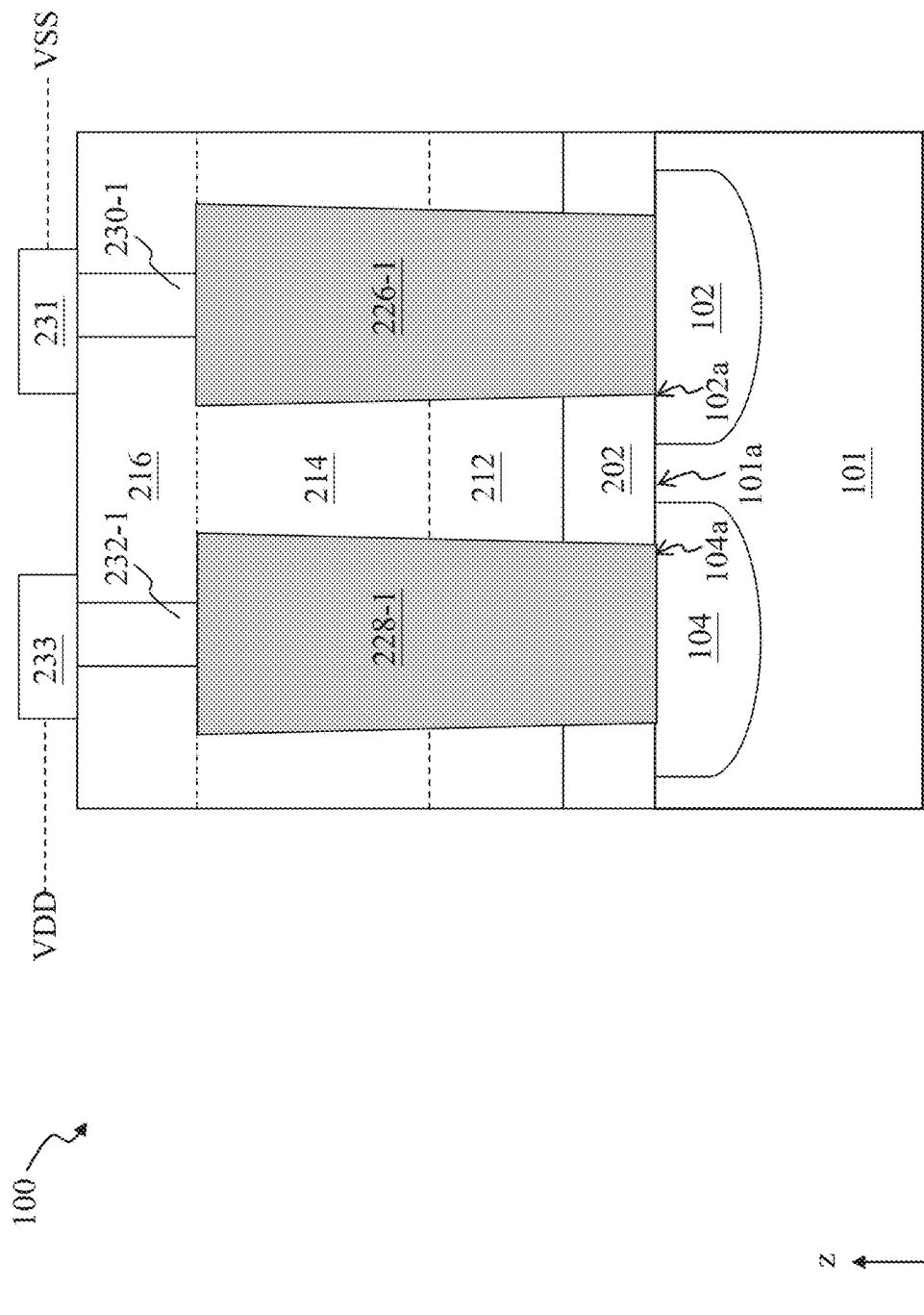
Figure 2D:
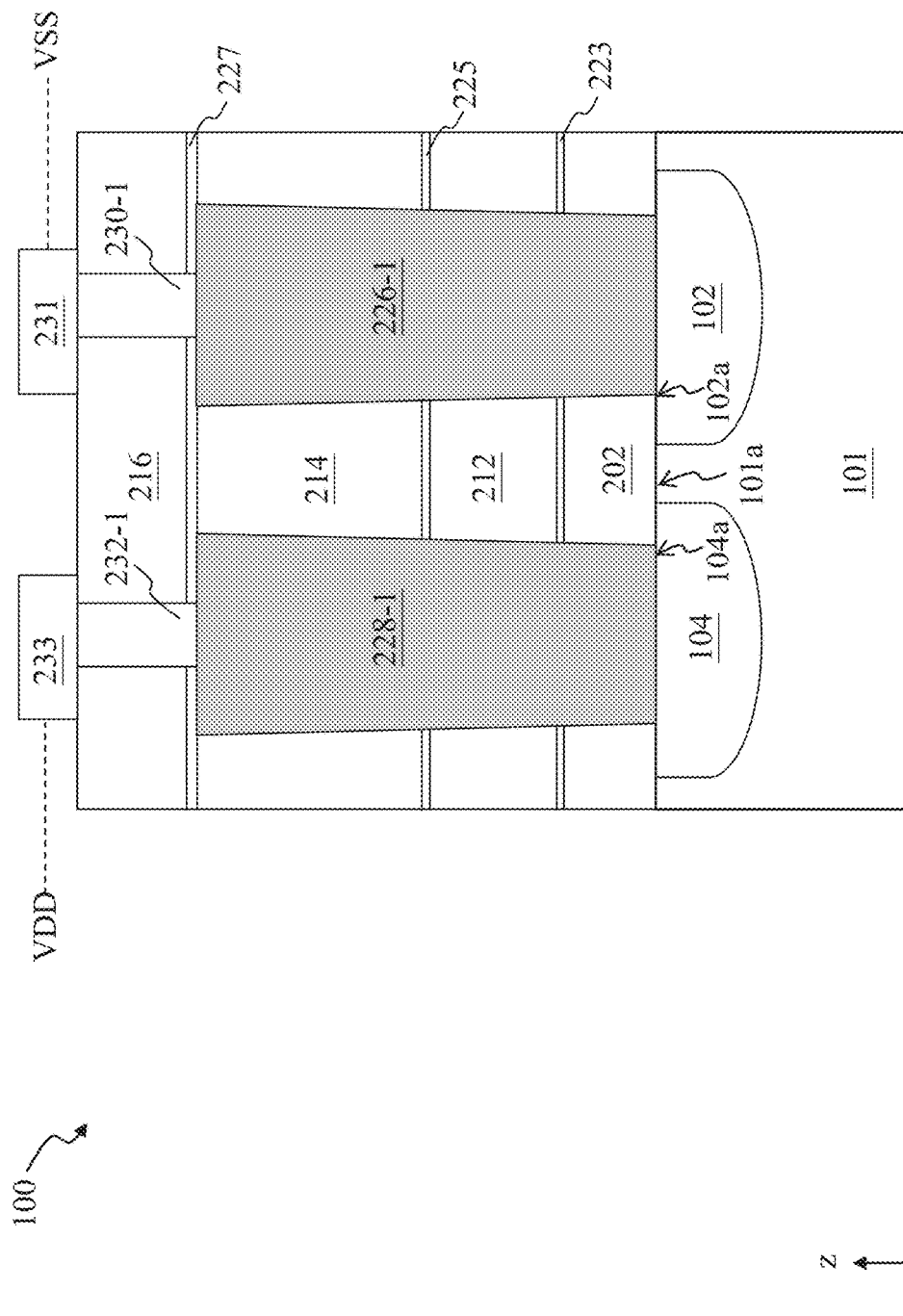
Figure 2E:
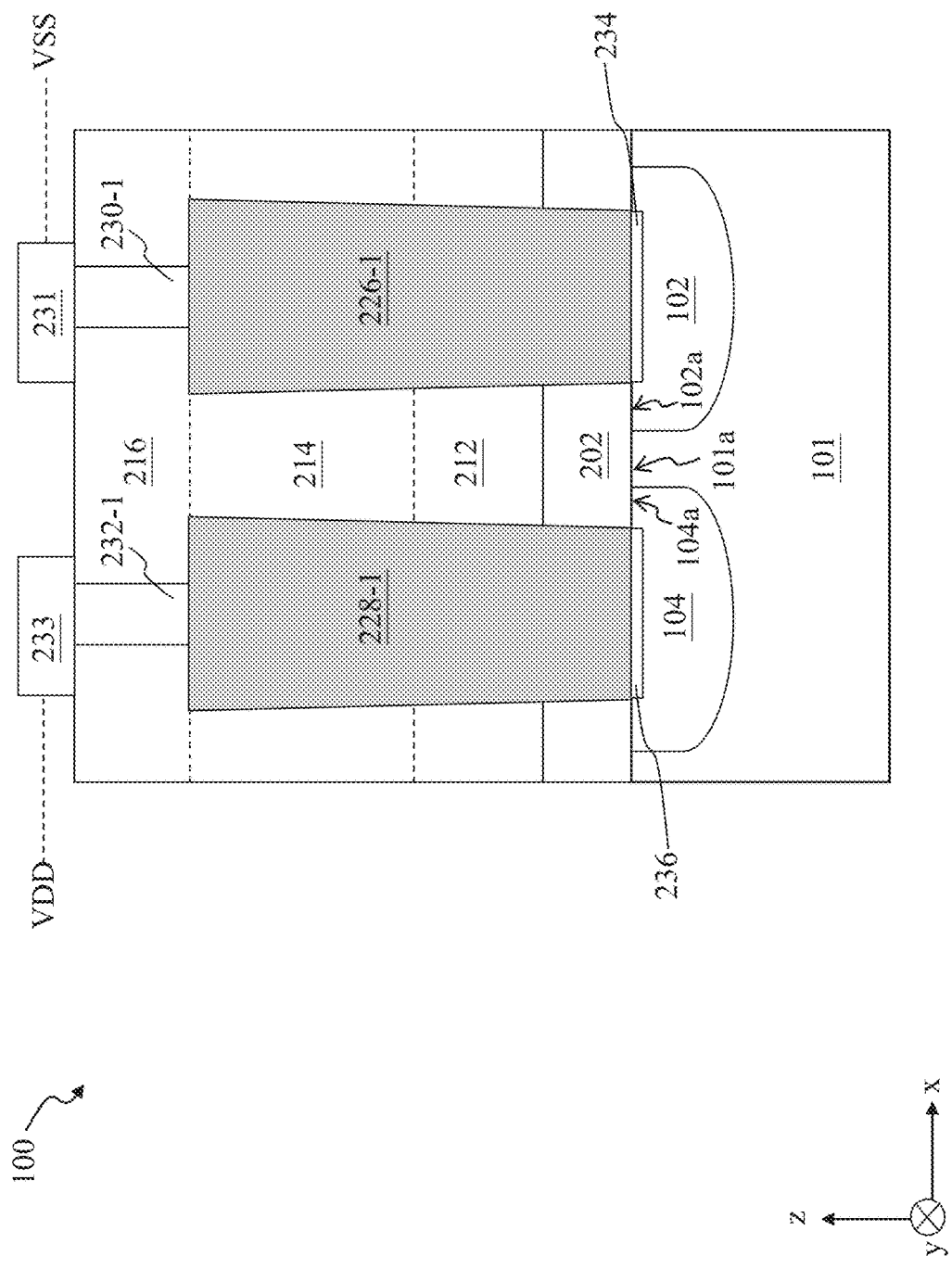

FIG. 1 shows a simplified top-down schematic view of an integrated circuit 100, in accordance with an embodiment. FIGS. 2A and 2B show embodiment diagrammatic cross-sectional views of the integrated circuit 100 of FIG. 1 along the line A-A (for example, in an x-z plane), in accordance with various embodiments. FIGS. 2C to 2E show various diagrammatic cross-sectional views of the integrated circuit 100 of FIG. 1 along the line B-B (for example, in the x-z plane), in accordance with various embodiments. It is noted that FIGS. 1 and 2A to 2E have been simplified for the sake of clarity and to highlight various features of the integrated circuit 100. Some of the features described below in reference to the examples of FIGS. 1 and 2A to 2E can be replaced, modified, or eliminated in other embodiments of the integrated circuit 100. Furthermore, other features may be added to the embodiments of FIGS. 1 and 2A to 2E without departing from the scope of this disclosure.

Referring to FIGS. 1 and 2A, the integrated circuit 100 includes a substrate (e.g. a wafer) 101. The substrate 101 may include silicon. Additionally or alternatively, the substrate 101 includes another elementary semiconductor material, such as germanium; a compound semiconductor material, such as silicon carbide, silicon phosphide, gallium arsenide, gallium phosphide, indium phosphide, indium arsenide, and/or indium antimonide; an alloy semiconductor material, such as SiGe, SiPC, GaAsP, AlInAs, AlGaAs, GaInAs, GaInP, and/or GaInAsP; or combinations thereof. In some embodiments, the substrate 101 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, substrate 101 includes one or more group III-V materials or one or more group II-IV materials.

The substrate 101 includes various doped regions configured according to design requirements of the integrated circuit 100. For example, the substrate 101 may include p-type doped regions (for example, p-type wells) doped with p-type dopants, such as boron (for example, $BF_2$), indium, other p-type dopants, or combinations thereof. Additionally or alternatively, the substrate 101 may include n-type doped regions (for example, n-type wells) doped with n-type dopants, such as phosphorus, arsenic, other n-type dopants, or combinations thereof. The various doped regions can be formed directly on and/or in substrate 101, for example, providing a p-well structure, an n-well structure, a dual-well structure, a raised structure, or combinations thereof. As described in further detail below, an ion implantation process, a diffusion process, or other suitable doping process can be performed either individually or in combination to form the various doped regions. In the embodiments shown in FIGS. 1 and 2A, the various doped regions of the substrate 101 are depicted as a p-well region 102 and an n-well region 104 that extend into the substrate 101 from a major surface 101a of the substrate 101. The p-well region 102 has a major surface 102a that is substantially coplanar with the major surface 101a of the substrate 101. Similarly, the n-well region 104 includes has a major surface 104a that is substantially coplanar with the major surface 101a of the substrate 101. In some embodiments, the major surfaces 101a, 102a, and 104a may be planar surfaces that lie in an x-y plane of the integrated circuit 100, as illustrated in the example of FIG. 2A. In some embodiments, the p-well region 102 has a p-type dopant concentration of about $1\times10^{16}$ cm$^{-3}$ to about $1\times10^{19}$ cm$^{-3}$, while the n-well region 104 has an n-type dopant concentration of about $1\times10^{16}$ cm$^{-3}$ to about $1\times10^{19}$ cm$^{-3}$.

The p-well region 102 includes a circuit region (e.g. device region) 106-1 having one or more transistor structures formed therein. The p-well region 102 further includes a p-well pick-up region 108-1 having one or more p-well strap structures formed therein. Similarly, the n-well region 104 includes a circuit region (e.g. device region) 106-2 having one or more transistor structures formed therein. The n-well region 104 further includes an n-well pick-up region 108-2 having one or more n-well strap structures. The p-well strap structures and n-well strap structures are described in further detail below in reference to FIGS. 2C to 2E. The one or more transistor structures in the circuit regions 106-1, 106-2 may implement, or may be a part of, a memory cell or a circuit (e.g. a logic circuit). Examples of circuits that may be formed in the circuit regions 106-1, 106-2 include, but are not limited to, inverters, NAND gates, NOR gates, AND gates, OR gates, flip-flops, among others.

In the example of FIGS. 1 and 2A, the transistor structure in the circuit region 106-1 of the p-well region 102 are depicted as two fins 110-1, 110-2. Similarly, the transistor structure in the circuit region 106-2 of the n-well region 104 is depicted as two fins 118-1, 118-2. In other embodiments, the transistor structure in the circuit regions 106-1, 106-2 may have a different number of fins. Furthermore, embodiments of the present disclosure contemplate other types of transistor structures being formed in the circuit regions 106-1, 106-2 (e.g., GAA transistors). It is noted that fins 110-1 and 110-2 extend away from the substrate 101 from the major surface 102a of the p-well region 102 and have the same conductivity-type as the p-well region 102, while fins 118-1, 118-2 extend away from the substrate 101 from the major surface 104a of the n-well region 104 and have the same conductivity-type as the n-well region 104. In some embodiments, the p-type dopant concentration of the fins 110-1, 110-2 may be similar to the p-type dopant concentration of the p-well region 102, while the n-type dopant concentration of the fins 118-1, 118-2 may be similar to the n-type dopant concentration of the n-well region 104.

The p-well region 102, n-well region 104, and fins 110-1, 110-2, 118-1, 118-2 may be formed by any suitable process. In some embodiments, a combination of deposition, lithography, etching, and/or implantation processes are performed to define these features. For example, an embodiment process for forming the p-well region 102, n-well region 104, and fins 110-1, 110-2, 118-1, 118-2 includes forming fin structures from the substrate 101 and subsequently performing a doping process to define the p-well region 102, n-well region 104, and fins 110-1, 110-2, 118-1, 118-2. In such a process, the step of forming fin structures from the substrate 101 includes performing a lithography process to form a patterned resist layer over the substrate 101 and performing an etching process to transfer a pattern defined in the patterned resist layer to the substrate 101.

The lithography process used to form the fin structures can include forming a resist layer on the substrate 101 (for example, by spin coating), performing a pre-exposure baking process, performing an exposure process using a mask, performing a post-exposure baking process, and performing a developing process. During the exposure process, the resist layer is exposed to radiation energy (for example, ultraviolet (UV) light, deep UV (DUV) light, or extreme UV (EUV) light). The mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask.

The etching process that follows the lithography process uses the patterned resist layer as an etch mask to remove portions of the substrate 101 that are exposed. The etching process can include a dry etching process (for example, a reactive ion etching (RIE) process), a wet etching process, other suitable etching process, or combinations thereof. After the etching process, the patterned resist layer is removed from the substrate 101, for example, by a resist stripping process, thereby defining fin structures extending out of the substrate 101 from the major surface 101a of the substrate 101.

The above-described process of forming the fin structures is one of other suitable processes. For example, in other embodiments, fin structures may be formed from the substrate 101 by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Additionally or alternatively, directed self-assembly (DSA) techniques are implemented while forming fin structures from the substrate 101. Further, in some embodiments, the exposure process can implement maskless lithography, electron-beam (e-beam) writing, ion-beam writing, and/or nanoimprint technology for patterning the resist layer and/or other layers.

Subsequent to forming the fin structures, a doping process is performed. As an example, a lithography process is performed to mask (e.g. cover) a first region of the substrate 101 and fin structures formed in the first region, while a second region of the substrate 101 and fin structures formed in the second region are exposed. The second region of the substrate 101 and the fin structures formed therein are exposed to an ion implantation process and/or a diffusion process, thereby resulting in the p-well region 102 and fins 110-1, 110-2. A lithography process is then performed to cover the p-well region 102 and fins 110-1, 110-2, while the first region of the substrate 101 and the fin structures formed therein are exposed to an ion implantation process and/or a diffusion process, thereby resulting in the n-well region 104 and fins 118-1, 118-2. In some embodiments, the sequence of steps used to form the p-well region 102, n-well region 104, and fins 110-1, 110-2, 118-1, 118-2 may be different such that p-well region 102 and/or n-well region 104 are formed before forming fins 110-1, 110-2, 118-1, 118-2. In each of these embodiments, the result is fins 110-1, 110-2 that extend away from the substrate 101 from the major surface 102a of the p-well region 102, and fins 118-1, 118-2 that extend away from the substrate 101 from the major surface 104a of the n-well region 104.

As seen in FIG. 1, the integrated circuit 100 includes various gate structures 112-1, 112-2. The gate structures 112-1 may be active gate structures disposed in the circuit regions 106-1, 106-2. An active gate structure generally refers to an electrically functional gate structure of a transistor device. For example, gate structures 112-1 are formed over channel regions of fins 110-1, 110-2, 118-1, 118-2 to enable current to flow between source and drain regions of fins 110-1, 110-2, 118-1, 118-2. On the other hand, the gate structures 112-2 may be dummy gate structures disposed in the circuit regions 106-1, 106-2 and the well pick-up regions 108-1, 108-2. A dummy gate structure generally refers to an electrically non-functioning gate structure of a transistor device. In some embodiments, such as in the example of FIG. 1, the dummy gate structures 112-2 mimic physical properties of active gate structures 112-1, such as physical dimensions of the active gate structures 112-1, but are electrically inoperable and do not enable current to flow between source and drain regions of a transistor device. Each of the gate structures 112-1, 112-2 may have a width W1 (e.g. measured in the y direction in the top-down view of FIG. 1) that is substantially equal to a length of a channel formed between adjacent source/drain regions (e.g. in the range of about 2 nanometers and about 30 nanometers). It is also noted that the dummy gate structures 112-2 and the active gate structures 112-1 have the same routing direction (e.g. in the x-direction).

Gate structures 112-1, 112-2 may be formed using a gate-first process, a gate-last process, or a hybrid gate last/gate first process. The gate structures 112-1, 112-2 may be implemented using gate stacks including a gate dielectric, a gate electrode, and a hard mask layer. The gate dielectric includes a dielectric material, such as silicon oxide, a high-k dielectric material, other suitable dielectric material, or combinations thereof. A high-k dielectric material generally refers to dielectric materials having a dielectric constant (k), for example, greater than that of silicon oxide (where k of silicon oxide is about 3.9). Examples of such materials include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. In some embodiments, gate dielectric further includes an interfacial layer (including a dielectric material, such as silicon oxide) disposed between the high-k dielectric layer and fins 110-1, 110-2, 118-1, 118-2. Gate electrode is disposed over the gate dielectric. The gate electrode includes an electrically conductive material, and in some embodiments, the gate electrode includes multiple layers, such as a capping layer, a work function layer, a glue/barrier layer, and a metal fill (or bulk) layer.

The capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. The work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer can include a suitable conductive material, such as Al, W, and/or Cu. Gate dielectric and/or gate electrode may include numerous other layers, for example, capping layers, interface layers, diffusion layers, barrier layers, hard mask layers, or combinations thereof. The hard mask layer is disposed over the gate electrode and includes any suitable material, such as silicon and nitrogen (for example, silicon nitride).

The gate structures 112-1, 112-2 includes gate spacers 114 disposed adjacent to (for example, along sidewalls of) the respective gate structures 112-1, 112-2. Gate spacers 114 may be formed by any suitable process and may include one or more dielectric materials. For example, the gate spacers 114 may include a single layer or multiple layers of materials, including $SiO_2$, SiON, $Si_3N_4$, SiOCN, a dielectric material having a dielectric constant less than 3.5, or combinations thereof.

FIG. 2A shows an isolation layer 202 (e.g. a non-conformal isolation layer) that is formed on the substrate 101 (e.g. on the major surface 101a of the substrate 101) to separate and isolate circuit regions 106-1, 106-2, the p-well pick-up region 108-1, and the n-well pick-up region 108-2 from one another. The isolation layer 202 further separates and isolates fins 110-1, 110-2, 118-1, 118-2 from one another. In the example shown in FIG. 2A, the isolation layer 202 laterally surrounds a bottom portion BP of each of the fins 110-1, 110-2, 118-1, 118-2. The isolation layer 202 may include silicon oxide, silicon nitride, silicon oxynitride, other suitable isolation material (for example, including silicon, oxygen, nitrogen, carbon, or other suitable isolation constituent), or combinations thereof. The isolation layer 202 may include, or may be, a shallow trench isolation (STI) structure, deep trench isolation (DTI) structure, and/or local oxidation of silicon (LOCOS) structure. The isolation layer 202 may include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some embodiments, the isolation layer 202 includes a dielectric layer disposed over a doped liner layer (including, for example, boron silicate glass (BSG) or phosphosilicate glass (PSG)).

In some embodiments, the isolation layer 202 can be formed by depositing (e.g. blanket depositing) an insulator material on substrate 101 after forming fins 110-1, 110-2, 118-1, 118-2, such that the insulator material layer fills gaps (e.g. trenches) between fins 110-1, 110-2, 118-1, 118-2, and etching back the insulator material layer to expose a top portion TP of the fins 110-1, 110-2, 118-1, 118-2, thereby forming the isolation layer 202. It is noted that in some embodiments, a height of each of the fins 110-1, 110-2, 118-1, 118-2 (e.g. as measured along the z-direction from the major surface 101a of the substrate 101 to a farthest-most surface of the channel region fins 110-1, 110-2, 118-1, 118-2) may be greater than 80 nanometers. It is also noted that in embodiments where transistor structures are implemented as GAA-type transistors, a distance (e.g. as measured along the z-direction) from the major surface 101a of the substrate 101 to a farthest-most surface of the GAA channel region may also be greater than 80 nanometers.

The circuit region 106-1 of the p-well region 102 may have one or more n-type metal-oxide-semiconductor (NMOS) transistors formed therein, while the circuit region 106-2 of the n-well region 104 may have one or more p-type MOS (PMOS) transistors formed therein. In some embodiments, the NMOS transistors may include epitaxial source features and epitaxial drain features (referred to as epitaxial source/drain features 204) disposed over the source/drain regions of fins 110-1, 110-2. Additionally or alternatively, the PMOS transistors may include epitaxial source/drain features 206 disposed over the source/drain regions of fins 118-1, 118-2. For example, semiconductor material may be epitaxially grown on fins 110-1, 110-2 and 118-1, 118-2, forming epitaxial source/drain features 204 and 206, respectively. In some embodiments, epitaxial source/drain features 204 and 206 are respectively formed over the source/drain regions of fins 110-1, 110-2 and 118-1, 118-2 after a fin recess process (for example, an etch back process), such that epitaxial source/drain features 204 and 206 are grown from recessed fins 110-1, 110-2 and 118-1, 118-2, respectively. In other embodiments, the epitaxial source/drain features 204 and 206 may wrap the source/drain regions of fins 110-1, 110-2 and 118-1, 118-2, respectively. In such embodiments, fins 110-1, 110-2, 118-1, 118-2 may not be subjected to a fin recess process.

In FIG. 2A, epitaxial source/drain features 204, 206 extend (e.g. grow) laterally along the x-direction (in some embodiments substantially perpendicular to fins 110-1, 110-2, 118-1, 118-2), such that epitaxial source/drain features 204, 206 are merged features that span more than one fin. For example, epitaxial source/drain feature 204 spans fins 110-1, 110-2, and epitaxial source/drain feature 206 spans fins 118-1, 118-2. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors.

Epitaxial source/drain feature 204 is doped with n-type dopants, while epitaxial source/drain feature 206 is doped with p-type dopants. Consequently, epitaxial source/drain feature 204 may function as an n-doped source/drain region of the NMOS transistor in the circuit region 106-1 of the p-well region 102, and epitaxial source/drain feature 206 may function as a p-doped source/drain region of the PMOS transistor in the circuit region 106-2 of the n-well region 104. The epitaxial source/drain feature 204 includes epitaxial layers including silicon and/or carbon, where silicon-containing epitaxial layers or silicon-carbon-containing epitaxial layers are doped with phosphorous, arsenic, other n-type dopants, or combinations thereof (for example, forming a Si:P epitaxial layer, a Si:C epitaxial layer, a Si:C:P epitaxial layer, a Si:As epitaxial layer, or combinations thereof). Epitaxial source/drain feature 206 includes epitaxial layers including silicon and/or germanium, where the silicon germanium containing epitaxial layers are doped with boron, carbon, other p-type dopants, or combinations thereof (for example, forming a Si:Ge:B epitaxial layer or a Si:Ge:C epitaxial layer). In some embodiments, the epitaxial source/drain feature 204 has an n-type dopant concentration of about $5 \times 10^{19}$ cm$^{-3}$ to about $1 \times 10^{22}$ cm$^{-3}$, while the epitaxial source/drain feature 206 has a p-type dopant concentration of about $1 \times 10^{19}$ cm$^{-3}$ to about $6 \times 10^{21}$ cm$^{-3}$.

The epitaxial source/drain features 204, 206 may include materials and/or dopants that achieve desired tensile stress and/or compressive stress in the channel regions of the NMOS and PMOS transistors, respectively. In some embodiments, the p-doped epitaxial source/drain feature 206 is adjacent to a SiGe channel region where the atomic concentration of Ge is in a range of about 5 percent and about 35 percent. The epitaxial source/drain features 204, 206 may be doped during deposition by adding impurities to a source material of the epitaxy process. The epitaxial source/drain features 204, 206 may, alternatively or additionally, be doped by an ion implantation process subsequent to a deposition process. An annealing process may be performed to activate dopants in epitaxial source/drain features 204, 206. Doping of the epitaxial source/drain features 204, 206 may be performed in conjunction with photomasks (e.g. N+ photomask or P+ photomask). The N+ photomask used to form the epitaxial source/drain feature 204 over the p-well region 102 may cover both the circuit region 106-1 and the pick-up region 108-1 of the p-well region 102. Similarly, the P+ photomask used to form the epitaxial source/drain feature 206 over the n-well region 104 may cover both the circuit region 106-2 and the pick-up region 108-2 of the n-well region 104. This allows for simplicity in forming the doping masks for the epitaxial source/drain features 204, 206 since, as described in further detail below in reference to FIGS. 2C to 2E, no anti-type source/drain masking step is required for doping the well pick-up regions 108-1, 108-2.

As shown in FIG. 2A, silicide layers 208, 210 may be formed on or within epitaxial source/drain features 204, 206, respectively. In some embodiments, silicide layers 208, 210 are formed by depositing a metal layer over epitaxial source/drain features 204, 206. The metal layer includes any material suitable for promoting silicide formation, such as nickel, platinum, palladium, vanadium, titanium, cobalt, tantalum, ytterbium, zirconium, other suitable metal, or combinations thereof. Integrated circuit 100 is then heated (for example, subjected to an annealing process) to cause constituents of epitaxial source/drain features 204, 206 (for example, silicon and/or germanium) to react with the metal. The silicide layers 208, 210 thus include metal and a material of epitaxial source/drain features 204, 206, respectively. In some embodiments, the silicide layers 208, 210 include nickel silicide, titanium silicide, or cobalt silicide. Any un-reacted metal, such as remaining portions of the metal layer, is selectively removed by any suitable process, such as an etching process.

The integrated circuit 100 further includes one or more dielectric layers 212, 214, 216 disposed on or over the isolation layer 202. For example, a first dielectric layer 212 (e.g. inter-layer dielectric 0, abbreviated as ILD-0) may be disposed over the isolation layer 202, a second dielectric layer 214 (e.g. ILD-1) may be disposed on or over the first dielectric layer 212, and a third dielectric layer 216 (e.g. ILD-2) may be disposed on or over the second dielectric layer 214. The one or more dielectric layers 212, 214, 216 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, one or more dielectric layers 212, 214, 216 may include a low-k dielectric material (generally referred to as low-k dielectric layers, which may have a dielectric constant (k) that is less than 3).

In some embodiments, such as in the example shown in FIG. 2B, there may be one or more etch stop layers (ESLs) 223, 225, 227 formed in the integrated circuit 100. For example, the embodiment shown in FIG. 2B shows ESL 223 lining (e.g. conformally formed over) the sidewalls of the top portions TP of fins 110-1, 110-2, 118-1, 118-2 and the sidewalls of the epitaxial source/drain features 204, 206. The ESL 223 is also disposed on the isolation layer 202. Consequently, ESL 223 physically separates the isolation layer 202 from the dielectric layer 212. FIG. 2B additionally shows ESL 225 formed between dielectric layer 212 and dielectric layer 214. Also shown in FIG. 2B is ESL 227, which is formed between dielectric layer 214 and dielectric layer 216. The ESLs 223, 225, 227 include a material different from the isolation layer 202 and/or dielectric layers 212, 214, 216. For example, where the dielectric layers 212, 214, 216 include a low-k dielectric material, ESLs 223, 225, 227 include silicon and nitrogen, such as silicon nitride or silicon oxynitride.

The dielectric layers 212, 214, 216 and the ESLS 223, 225, 227 may be formed by a deposition process (e.g. blanket deposition process), such as CVD, PVD, ALD, HDPCVD, MOCVD, RPCVD, PECVD, LPCVD, ALCVD, APCVD, plating, other suitable methods, or combinations thereof. In some embodiments, the dielectric layers 212, 214, 216 and the ESLS 223, 225, 227 are formed by a flowable CVD (FCVD) process that includes, for example, depositing a flowable material (such as a liquid compound) on an underlying layer and converting the flowable material to a solid material by a suitable technique, such as thermal annealing and/or ultraviolet radiation treating. Subsequent to the deposition of the dielectric layers 212, 214, 216, a CMP process and/or other planarization process is performed, such that the dielectric layers 212, 214, 216 have substantially planar surfaces.

Contacts 218-3, 220-3 and vias 222-3, 224-3 are disposed in the one or more dielectric layers 212, 214, 216 to form interconnect structures. The contacts 218-3, 220-3 and vias 222-3, 224-3 include any suitable electrically conductive material, such as Ta, Ti, Al, Ni, Mo, Pt, Ru, Cu, Co, W, TiN, TaN, other suitable conductive materials, or combinations thereof. Various conductive materials can be combined to provide contacts 218-3, 220-3 and vias 222-3, 224-3 with various layers, such as a barrier layer, an adhesion layer, a liner layer, a bulk layer, other suitable layer, or combinations thereof. In some embodiments, contacts 218-3, 220-3 include Ti, TiN, and/or Co, while vias 222-3, 224-3 include Ti, TiN.

The contacts 218-3, 220-3 and vias 222-3, 224-3 are formed by patterning the one or more dielectric layers 212, 214, 216. Patterning the one or more dielectric layers 212, 214, 216 can include lithography processes and/or etching processes to form openings (trenches), such as contact openings and/or via openings in respective dielectric layers 212, 214, 216. In some embodiments, the lithography processes include forming a resist layer over respective dielectric layers 212, 214, 216, exposing the resist layer to patterned radiation, and developing the exposed resist layer, thereby forming a patterned resist layer that can be used as a masking element for etching opening(s) in respective dielectric layers 212, 214, 216. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of dielectric layers 212, 214, 216, contacts 218-3, 220-3 and vias 222-3, 224-3.

Contact 218-3 (also referred to as a local interconnect or local contact) electrically and/or physically couples a source/drain region, such as the epitaxial source/drain feature 204, of the NMOS transistor in the p-well region 102 to via 222-3. In like manner, contact 220-3 electrically and/or physically couples a source/drain region, such as the epitaxial source/drain feature 206, of the PMOS transistor in the n-well region 104 to via 222-4. In the depicted embodiment, via 222-3 is disposed on contact 218-3, such that via 222-3 electrically and/or physically couples contact 218-3 to a first power supply line M1-1, which may be electrically connected to a first power supply voltage VSS. FIG. 2A also shows that via 224-3 is disposed on contact 220-3, such that via 224-3 electrically and/or physically couples contact 220-3 to a second power supply line M1-2, which may be electrically connected to a second power supply voltage VDD. The first power supply voltage VSS may be configured as ground and/or a negative supply voltage, depending on design requirements. The second power supply voltage VDD may be configured as a positive supply voltage, depending on design requirements.

As depicted in FIG. 1 and discussed above, the p-well region 102 additionally includes the p-well pick-up region 108-1, while the n-well region 104 additionally includes the n-well pick-up region 108-2. The p-well pick-up region 108-1, which may be devoid of transistor structures, includes a p-well strap structure that electrically and/or physically couples the p-well region 102 to the first power supply voltage VSS. The n-well pick-up region 108-2, which may also be free from transistor structures, includes an n-well strap structure that electrically and/or physically couples the n-well region 104 to the second power supply voltage VDD.

FIG. 2C shows a first embodiment of a p-well strap structure 226-1, 230-1 and an n-well strap structure 228-1, 232-1. The p-well strap structure 226-1, 230-1 includes a first conductive plug 226-1 that extends through the second dielectric layer 214, the first dielectric layer 212, and the isolation layer 202 to physically contact the major surface 102a of the p-well region 102. Similarly, the n-well strap structure 228-1, 232-1 includes a second conductive plug 228-1 that extends through the second dielectric layer 214, the first dielectric layer 212, and the isolation layer 202 to physically contact the major surface 104a of the n-well region 104. It is noted that the conductive plug 226-2 shown in FIG. 1 is similar in structure, size, and composition to the conductive plug 226-1, while the conductive plug 228-2 shown in FIG. 1 is similar in structure, size, and composition to the conductive plug 228-1. Each of the conductive plugs 226-1, 226-2, 228-1, 228-2 may have a first dimension (e.g. a width W2 measured in the y direction in the top-down view of FIG. 1) that is between 5 nanometers and 60 nanometers, and a second dimension (e.g. a width W3 measured in the x direction in the top-down view of FIG. 1) that is between 10 nanometers and 300 nanometers. In some embodiments, the conductive plugs 226-1, 226-2, 228-1, 228-2 may have a rectangular shape in a top-down view, and the width W3 may be greater than the width W2 by at least 1.5 times.

The first conductive plug 226-1 and the second conductive plug 228-1 may include any suitable electrically conductive material, such as the materials described above in reference to contact 218-3. For example, the first conductive plug 226-1 and the second conductive plug 228-1 may include Ti, TiN, Ni, Mo, Pt, Co, Ru, W, TaN, Cu, or combinations thereof. The first conductive plug 226-1 and/ or the second conductive plug 228-1 may include a single conductive material layer or may include a plurality of conductive material layers.

The p-well strap structure 226-1, 230-1 and n-well strap structure 228-1, 232-1 also respectively include via 230-1 and via 232-1 that are formed in the third dielectric layer 216. The via 230-1 is disposed on the first conductive plug 226-1, such that via 230-1 electrically and/or physically couples first conductive plug 226-1 to power supply line 231 that may be electrically connected to the first power supply voltage VSS. The via 232-1 is disposed on the second conductive plug 228-1, such that via 232-1 electrically and/or physically couples second conductive plug 228-1 to power supply line 233 that may be electrically connected to the second power supply voltage VDD. The vias 230-1, 232-1 may include any suitable electrically conductive material, such as the materials described above in reference to via 222-3. The first power supply voltage VSS may be provided to bias the p-well region 102, while the second power supply voltage VDD may be provided to bias the n-well region 104.

The proposed p-well strap structure 226-1, 230-1 and n-well strap structure 228-1, 232-1 provide several advantages, including reduced well pick-up resistance, significant improvements in latch-up performance, and efficient use of chip real estate. For example, since p-well strap structure 226-1, 230-1 and n-well strap structure 228-1, 232-1 physically contact the major surface of their respective well regions, contact area between conductive plugs and their respective well regions is increased, thereby reducing well pick-up resistance and improving latch-up immunity in integrated circuits (e.g. logic circuits or memory arrays) including the proposed well strap structures. Furthermore, as seen in FIG. 2C, since p-well strap structure 226-1, 230-1 and n-well strap structure 228-1, 232-1 physically contact the major surface of their respective well regions without the use of intervening semiconductor structures (e.g. fins) that extend away from the substrate 101 from the major surface of the well regions, no anti-type source/drain masking step is required for doping the well pick-up regions, thereby reducing complexity of a lithography/patterning step for n+ doping of the epitaxial source/drain feature 204 and p+ doping of the epitaxial source/drain feature 206.

FIG. 2D shows another embodiment of the n-well strap structure 226-1, 230-1 and n-well strap structure 228-1, 232-1, where ESLs 223, 225, 227 are formed in the integrated circuit 100. As illustrated in FIG. 2D, the first conductive plug 226-1 and the second conductive plug 228-1 extend through an entirety of the second dielectric layer 214, the ESL 225, the first dielectric layer 212, the ESL 223, and the isolation layer 202 to physically contact the major surface 102a of the p-well region 102 and the major surface 104a of the n-well region 104, respectively.

FIG. 2E shows another embodiment of the -well strap structure 226-1, 230-1 and n-well strap structure 228-1, 232-1, where a silicide layers 234, 236 is formed in p-well region 102 and n-well region 104, respectively. The silicide layer 234 may include materials similar to the silicide layer 210, while silicide layer 236 may include materials similar to the silicide layer 208. The embodiment shown in FIG. 2E provides the additional advantage of reducing pick-up RC effects in the well pick-up regions 108-1, 108-2. The silicide layers 234, 236 may be formed using the processes described above in reference to silicide layers 208, 210.

Figure 3:
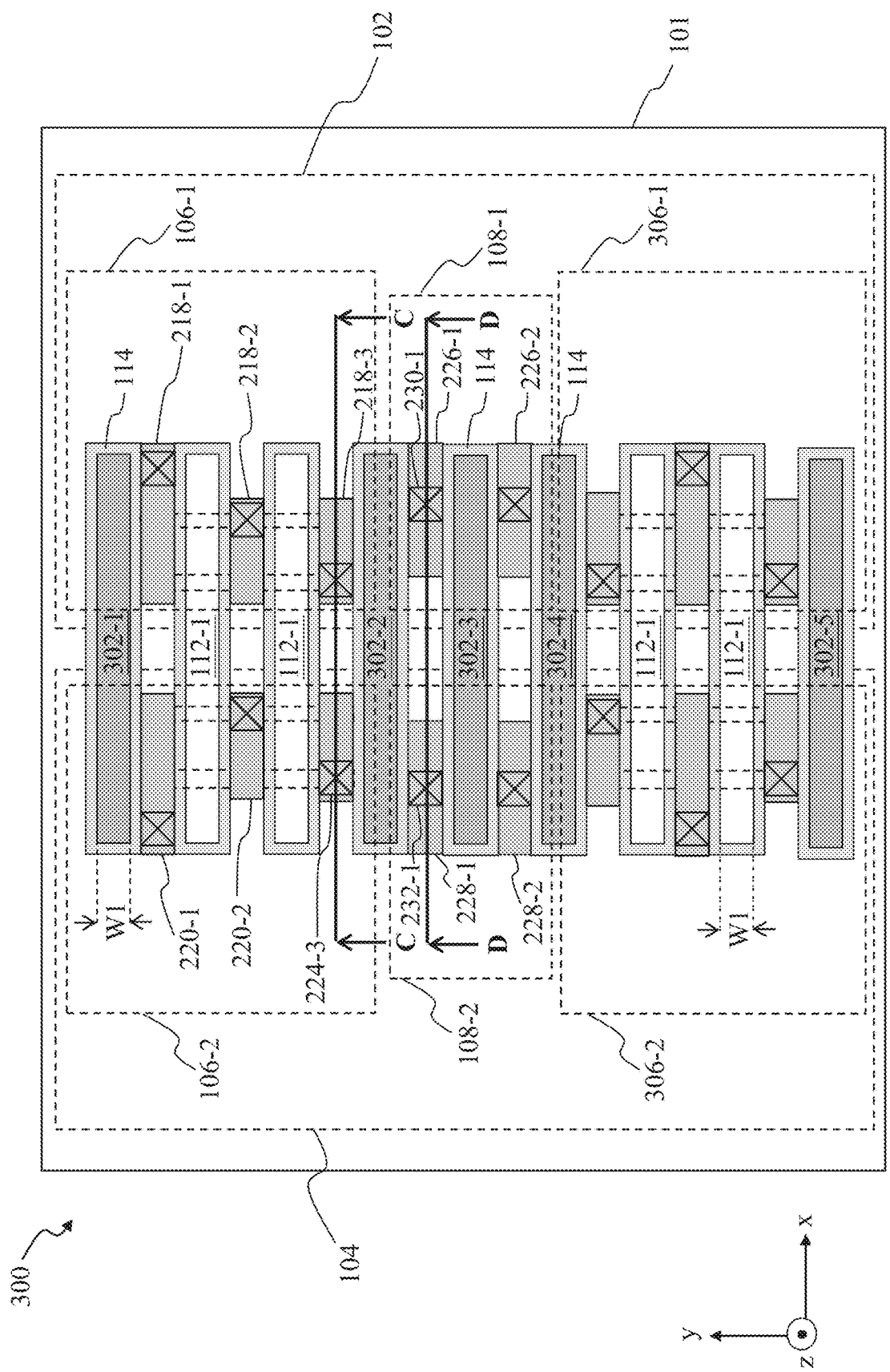

FIG. 3 shows a simplified schematic top-down view of an integrated circuit 300, in accordance with an embodiment. The integrated circuit 300 includes the p-well region 102, the n-well region 104, the circuit regions 106-1, 106-2, and the well pick-up regions 108-1, 108-2 described above in reference to FIGS. 1 and 2A to 2E. The cross-sectional views seen in FIGS. 2A and 2B may be the diagrammatic cross-sectional view of the integrated circuit 300 along the line C-C of FIG. 3 (for example, in the x-z plane), while FIGS. 2C to 2E may be diagrammatic cross-sectional views of the integrated circuit 300 along the line D-D of FIG. 3.

FIG. 3 also shows an additional circuit region 306-1 in the p-well region 102 and an additional circuit region 306-2 in the n-well region 104. The additional circuit regions 306-1, 306-2 may have one or more transistor structures formed therein. As with the example of FIG. 1, the one or more transistor structures in the additional circuit regions 306-1, 306-2 may implement, or may be a part of, a memory cell or a circuit (e.g. a logic circuit). Examples of circuits that may be formed in the additional circuit regions 306-1, 306-2 include, but are not limited to, inverters, NAND gates, NOR gates, AND gates, OR gates, flip-flops, among others.

The integrated circuit 300 of FIG. 3 further includes dielectric gate structures 302-1 to 302-5, which isolate (e.g. electrically isolate) the circuit regions 106-1, 106-2, the additional circuit regions 306-1, 306-2, and the well pick-up regions 108-1, 108-2 from one another. The width of each of the dielectric gate structures 302-1 to 302-5 may be equal to the width W1 described above in reference to FIG. 1. Furthermore, the dielectric gate structures 302-1 to 302-5 and the active gate structures 112-1 have the same routing direction (e.g. in the x-direction shown in FIG. 3). In order to achieve effective isolation, the dielectric gate structures 302-1 to 302-5 may be closer to the major surface 101a of the substrate 101 compared to the epitaxial source/drain features 204, 206. For example, the dielectric gate structures 302-1 to 302-5 may extend deeper toward the substrate 101 than the epitaxial source/drain features 204, 206 by at least 20 nanometers. The dielectric gate structures 302-1 to 302-5 may include a single layer or multiple layers of dielectric materials, including $SiO_2$, SiOC, SiON, SiOCN, a carbon-containing oxide, a nitrogen-containing oxide, a carbon- and nitrogen-containing oxide, a metal oxide dielectric, $HfO_2$, $Ta_2O_5$, $TiO_2$, $ZrO_2$, $Al_2O_3$, $Y_2O_3$, a metal-containing oxide, or combinations thereof.

As seen in FIG. 3, the dielectric gate structure 302-2 serves to isolate the p-well pick-up region 108-1 from the circuit region 106-1, while the dielectric gate structure 302-4 serves to isolate the p-well pick-up region 108-1 from the additional circuit region 306-1. Similarly, the n-well pick-up region 108-2 is isolated from the circuit region 106-2 and the additional circuit region 306-2 by dielectric gate structures 302-2 and 302-4, respectively. Consequently, since p-well strap structure 226-1, 230-1 and n-well strap structure 228-1, 232-1 physically contact their respective well regions without the use of an intervening semiconductor structure that extends from the major surface of their respective well regions, a well pick-up region can be separated from a circuit region by a single dummy gate (e.g. single dielectric gate structure 302-2) having a width substantially equal to a channel length (e.g. 2 nanometers to 30 nanometers). This obviates the need for a substantial dummy region/area between a circuit region and a well pick-up region, which, in turn, results in a more efficient use of chip area.

Figure 4:
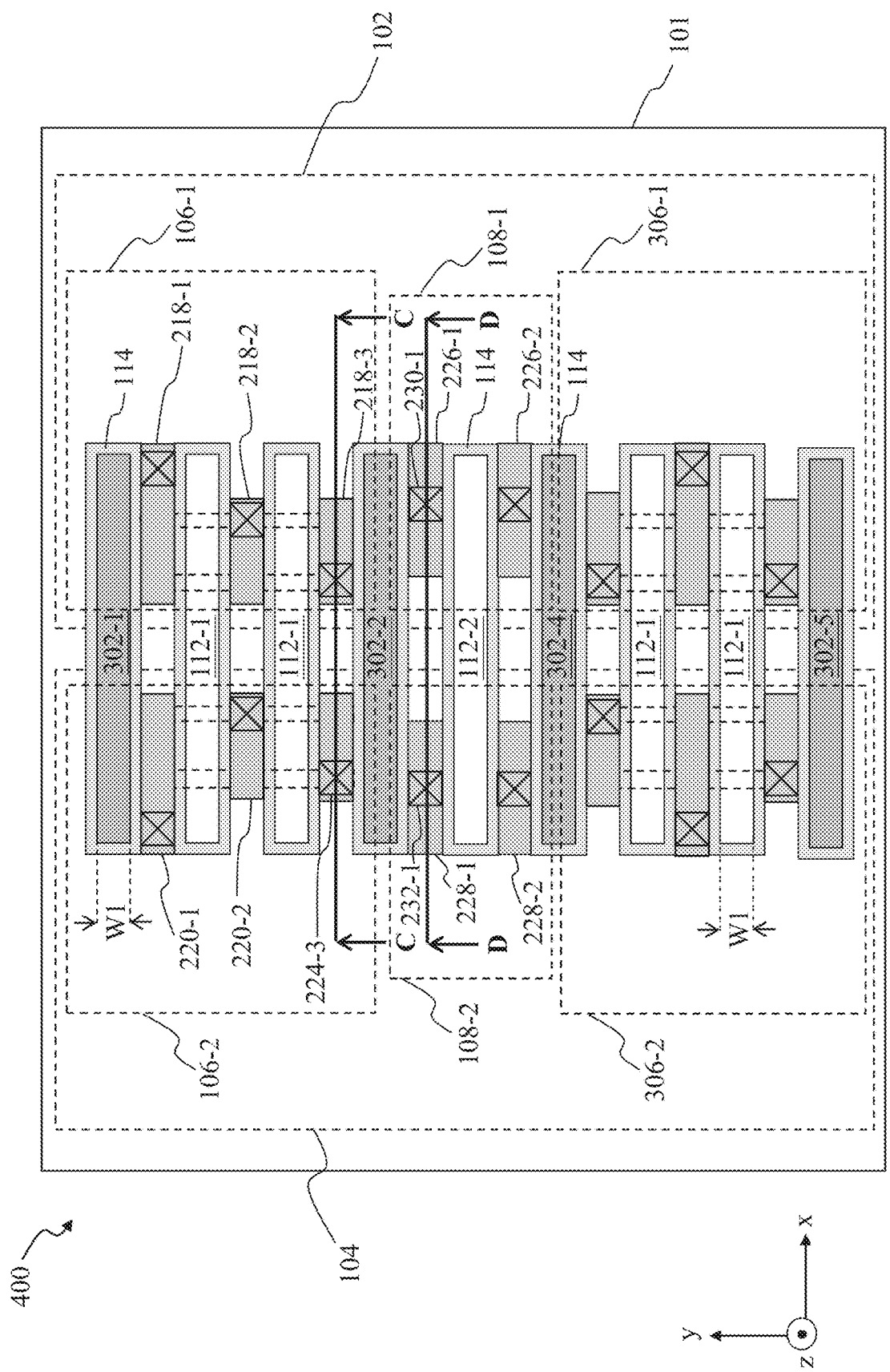

FIG. 4 shows a simplified schematic top-down view of an integrated circuit 400, in accordance with an embodiment. In the embodiment of FIG. 4, the dielectric gate structure 302-3 between conductive plugs 226-1 and 226-2 is replaced with the metal dummy gate structure 112-2 since each of these conductive plugs 226-1 and 226-2 contact the same p-well region 102 and isolation between conductive plugs 226-1 and 226-2 may not be necessary. Similarly, each of the conductive plugs 228-1 and 228-2 contact the same n-well region 104, and thus, isolation between the conductive plugs 228-1 and 228-2 may not be necessary. It is noted that isolation between conductive plugs 226-1, 226-2 and conductive plugs 228-1, 228-2 by the isolation between the p-well region 102 and the n-well region 104.

Figure 5:
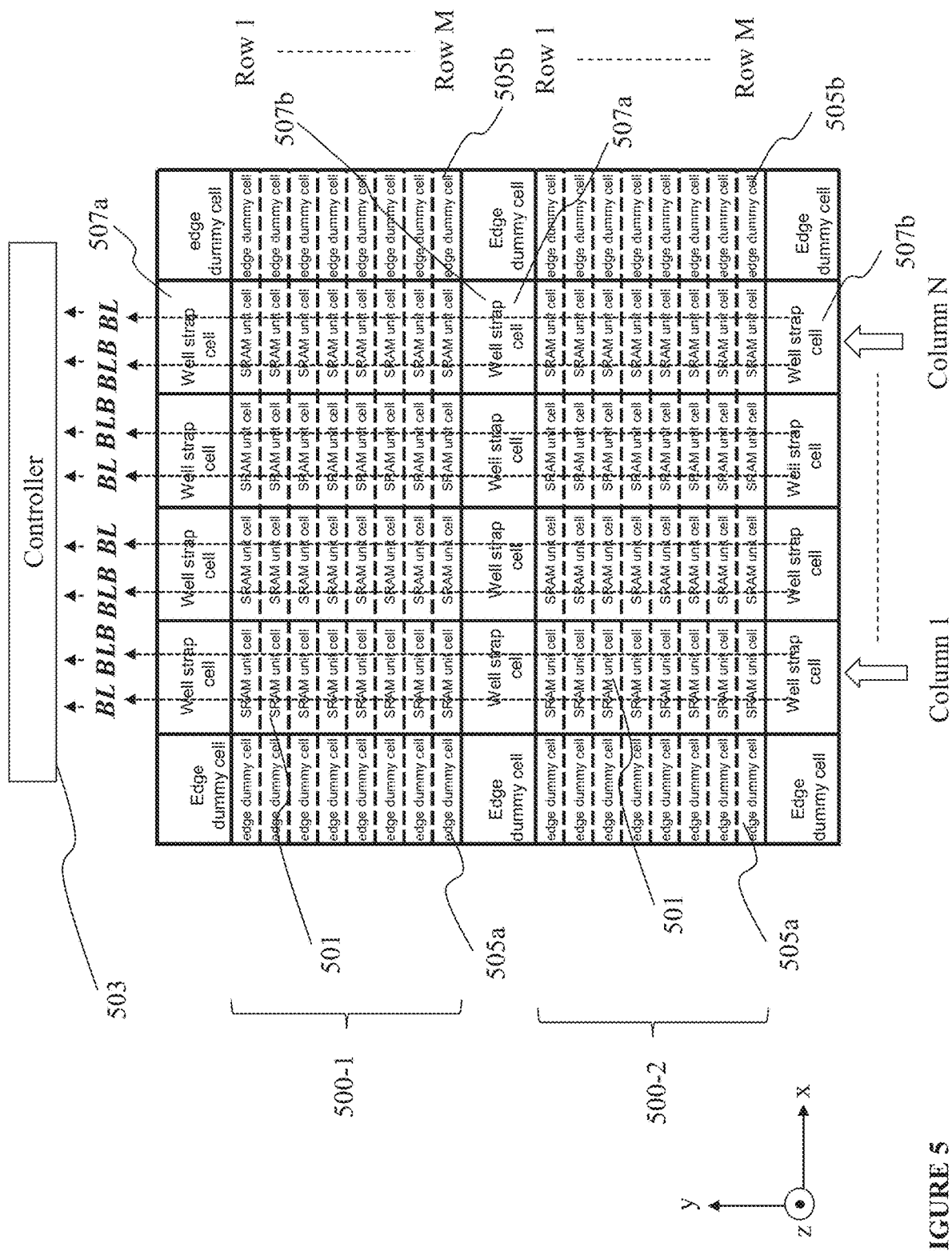
FIGS. 5 and 6 show simplified top-down schematic views of memory arrays, which can implement well strap structures configured as described herein, in accordance with various embodiments.

Well straps, such as p-type well strap 226-1, 230-1 and n-type well strap 228-1, 232-1 can be implemented in memory arrays to improve performance. FIG. 5 is a diagrammatic plan view showing a plurality of memory arrays 500-1, 500-2, each of which can implement well straps configured as described above, according to various aspects of the present disclosure. In the depicted embodiment, each memory array 500-1, 500-2 is a static random access memory (SRAM) array. However, the present disclosure contemplates embodiments, where memory arrays 500-1, 500-2 are another type of memory, such as a dynamic random access memory (DRAM), a non-volatile random access memory (NVRAM), a flash memory, or other suitable memory. Memory arrays 500-1, 500-2 may be included in a microprocessor, a memory, and/or other IC device. In some embodiments, memory arrays 500-1, 500-2 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 5 has been simplified for the sake of clarity to better understand the inventive concepts of the present disclosure. Additional features can be added in memory arrays 500-1, 500-2, and some of the features described below can be replaced, modified, or eliminated in other embodiments of memory arrays 500-1, 500-2.

Each of memory arrays 500-1, 500-2 includes memory cells 501, such as SRAM memory cells, configured to store data. In some embodiments, memory cells 501 include various p-type FinFETs and/or n-type FinFETs. Memory cells 501 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 501 in true form and complementary form on a column-by-column basis. Row 1 to row M each includes a word line (WL) (not shown) that facilitates access to respective memory cells 501 on a row-by-row basis. Each memory cell 501 is electrically connected to a respective BL, a respective BLB, and a respective WL, which are electrically connected to a controller 503.

Controller 503 is configured to generate one or more signals to select at least one WL and at least one-bit line pair (here, BL and BLB) to access at least one of memory cells 501 for read operations and/or write operations. Controller 503 includes any circuitry suitable to facilitate read/write operations from/to memory cells 501, including but not limited to, a column decoder circuit, a row decoder circuit, a column selection circuit, a row selection circuit, a read/write circuit (for example, configured to read data from and/or write data to memory cells 501 corresponding to a selected bit line pair, in other words, a selected column), other suitable circuit, or combinations thereof. In some embodiments, the controller 503 includes at least one sense amplifier configured to detect and/or amplify a voltage differential of a selected bit line pair. In some embodiments, the sense amplifier is configured to latch or otherwise store data values of the voltage differential.

A perimeter of each of memory arrays 500-1, 500-2 is configured with dummy cells, such as edge dummy cells and well strap cells, to ensure uniformity in performance of memory cells 501. Dummy cells are configured physically and/or structurally similar to memory cells 501, but do not store data. For example, dummy cells can include p-type wells, n-type wells, fin structures (including one or more fins), gate structures, source/drain features, and/or contact features. Well strap cells generally refer to dummy cells that are configured to electrically couple a voltage to an n-type well of memory cells 501, a p-type well of memory cells 501, or both. In the depicted embodiment, row 1 to row M each begin with an edge dummy cell 505a and end with an edge dummy cell 505b, such that row 1 to row M of memory cells 501 are disposed between edge dummy cells 505a and edge dummy cells 505b. Edge dummy cells 505a and edge dummy cells 505b are arranged in respective columns extending along the first direction (here, the y-direction). In some embodiments, the column of edge dummy cells 505a and/or the column of edge dummy cells 505b are substantially parallel to at least one bit line pair (here, BL and BLB) of memory array 500. In some embodiments, edge dummy cells 505a and/or edge dummy cells 505b are configured to connect respective memory cells 501 to respective WLs. In some embodiments, edge dummy cells 505a and/or edge dummy cells 505b include circuitry for driving WLs. In some embodiments, edge dummy cells 505a and/or edge dummy cells 505b are electrically connected to a second power supply voltage VDD (for example, a positive power supply voltage) and/or a first power supply voltage VSS (for example, an electrical ground) depending on design requirements of memory arrays 500-1, 500-2.

As shown in FIG. 5, for each of memory arrays 500-1, 500-2, column 1 to column N each begin with a well strap cell 507a and end with a well strap cell 507b, such that column 1 to column N of memory cells 501 are disposed between well strap cells 507a and well strap cells 507b. Well strap cells 507a and well strap cells 507b are arranged in respective rows extending along the second direction (here, the x-direction). In some embodiments, the row of well strap cells 507a and the row of well strap cells 507b are substantially parallel to at least one WL of memory arrays 500-1, 500-2. Well strap cells 507a are disposed between one of edge dummy cells 505a and one of edge dummy cells 505b, and well strap cells 507b are disposed between one of edge dummy cells 505a and one of edge dummy cells 505b. In the depicted embodiment, well strap cells 507a and/or well strap cells 507b include an n-type well strap, a p-type well strap, or both an n-type well strap and a p-type well strap. In some embodiments, well strap cells 507a and/or well strap cells 507b include an n-type well strap region having one or more n-type well straps disposed adjacent to a p-type well strap region having one or more p-type well straps. The n-type well strap region and the p-type well strap region may be disposed between dummy regions of the well strap cells 507a and/or the well strap cells 507b. In some embodiments, the p-type well strap is configured as the p-well pick-up region 108-1 described above in reference to FIGS. 1, 2A to 2E, 3, and 4, while the n-type well strap is configured as the n-well pick-up region 108-2 described above in reference to FIGS. 1, 2A to 2E, 3, and 4.

Figure 6:
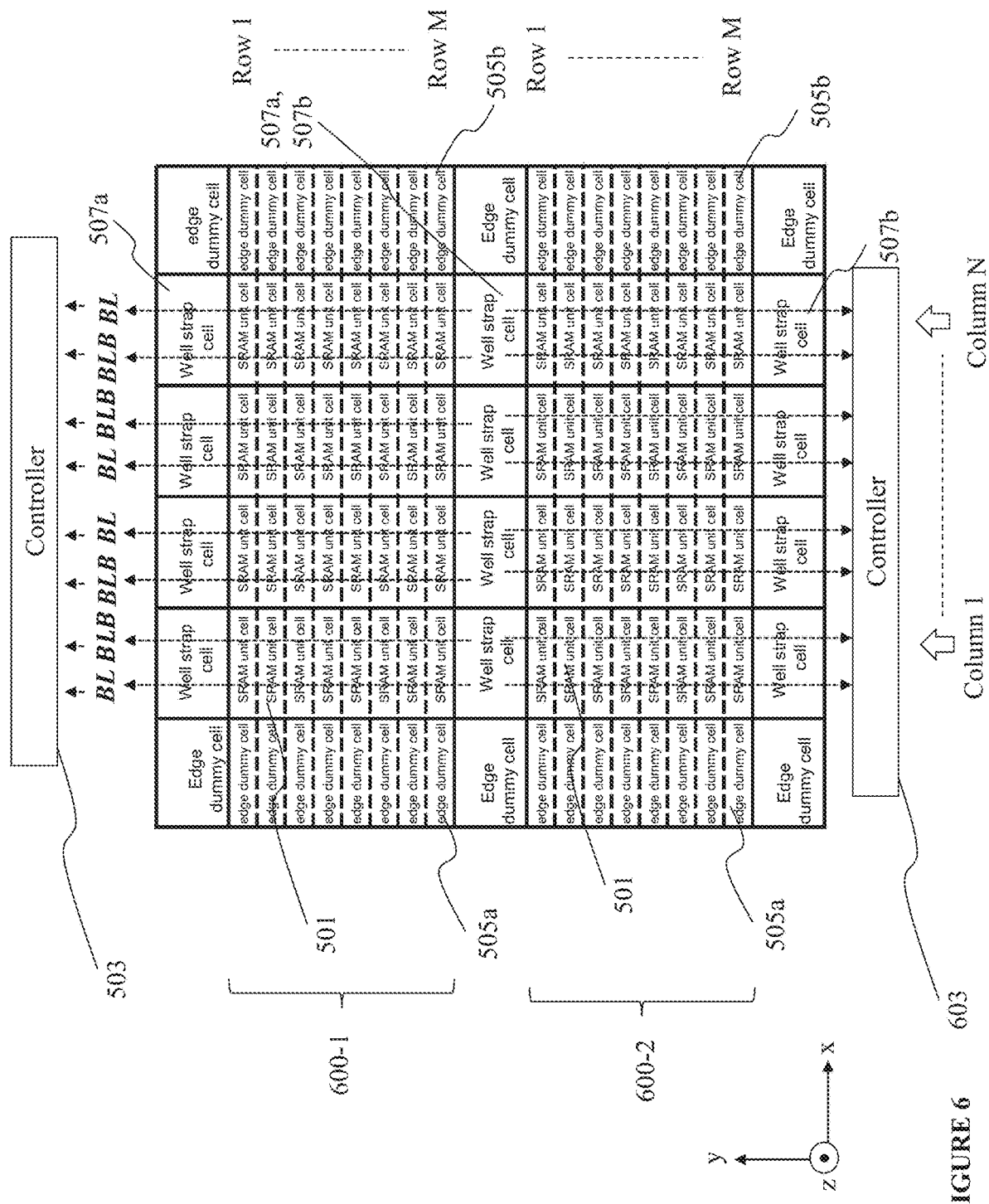

FIG. 6 is a diagrammatic plan view showing a plurality of memory arrays 600-1, 600-2, each of which can implement well straps configured as described above, according to various aspects of the present disclosure. Similar features in FIGS. 5 and 6 are identified by the same reference numerals for clarity and simplicity. In FIG. 5, memory cells 501 along a given column of each memory array 500-1, 500-2 share a common bit line BL and bit line bar BLB and a common controller 503. However, in FIG. 6, the memory cells 501 of memory array 600-1 and the memory cells 501 of memory array 600-2 are coupled to different controllers. For example, memory cells 501 of memory array 600-2 are coupled to controller 603 (which may be functionally and structurally similar to controller 503) by their respective bit lines BL and bit line bars BLB.

Figure 7A:
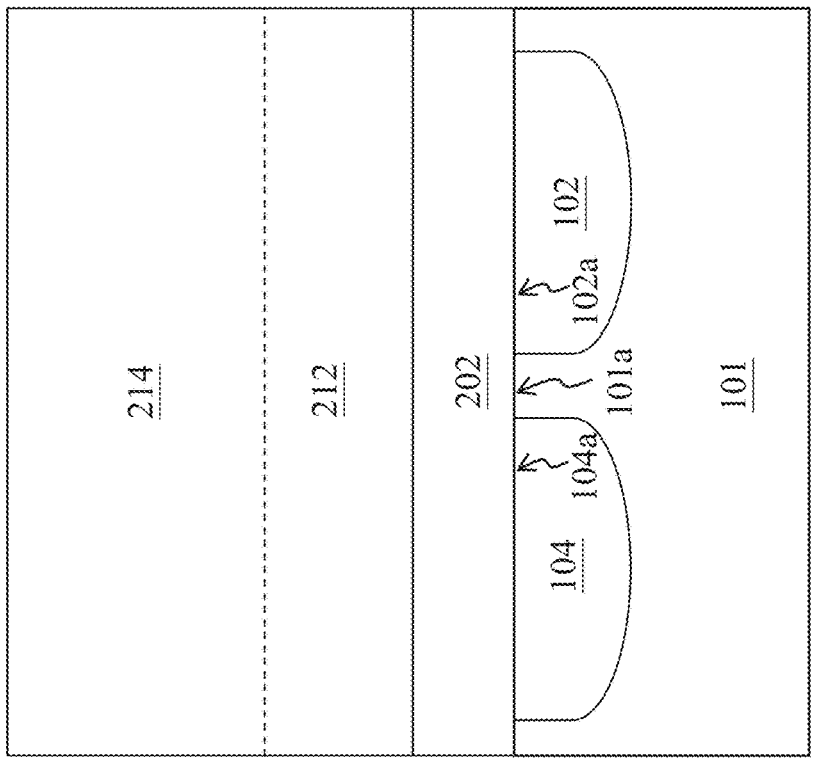
FIGS. 7A to 7F and FIGS. 9A to 9F show process flows for forming well strap structures configured as described herein, in accordance with various embodiments.
Figure 7A:
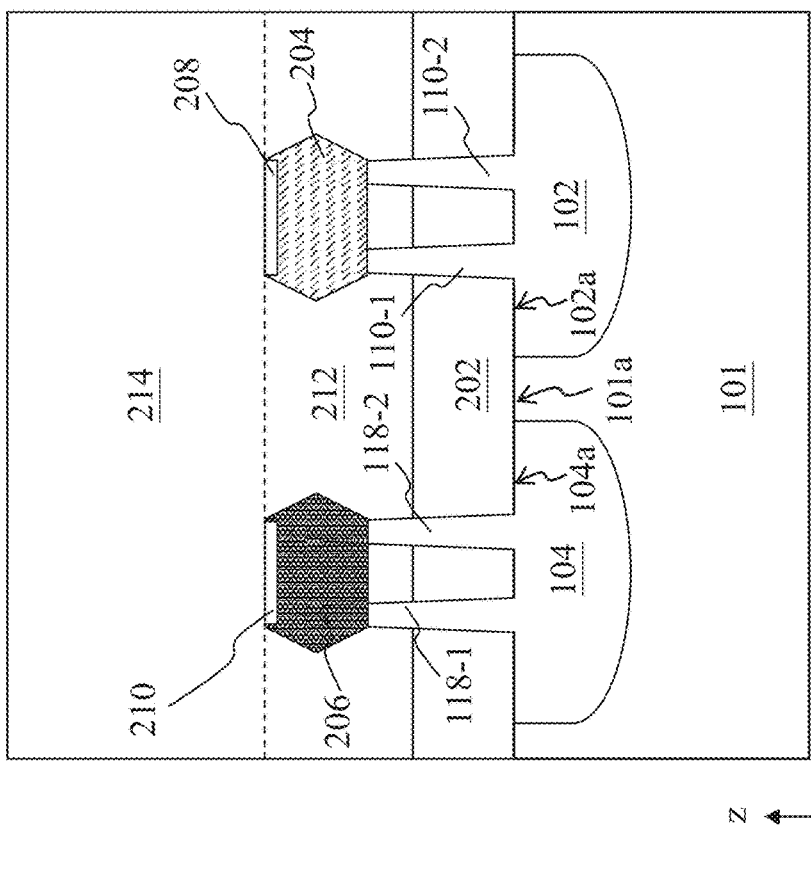

FIGS. 7A to 7F show a process flow that may be used to form the p-well strap structure 226-1, 230-1 and n-well strap structure 228-1, 232-1 described above, in accordance with an embodiment. FIG. 7A shows a structure where fins 110-1, 110-2 are formed in the circuit region 106-1 of the p-well region 102, while fins 118-1, 118-2 are formed in the circuit region 106-2 of the n-well region 104 using the process described in the foregoing description. It is noted that the no fin structures are formed in the well pick-up regions 108-1, 108-2. Subsequently, epitaxial source/drain features 204, 206 are formed over the source/drain regions of fins 110-1, 110-2, 118-1, 118-2 using the process described in the foregoing description. Additionally, silicide layers 208, 210 are formed on or within the epitaxial source/drain features 204, 206 using the process described in the foregoing description. The second dielectric layer 214 is subsequently deposited over the circuit regions 106-1, 106-2 and well pick-up regions 108-1, 108-2 to form the structure shown in FIG. 7A.

Figure 7B:
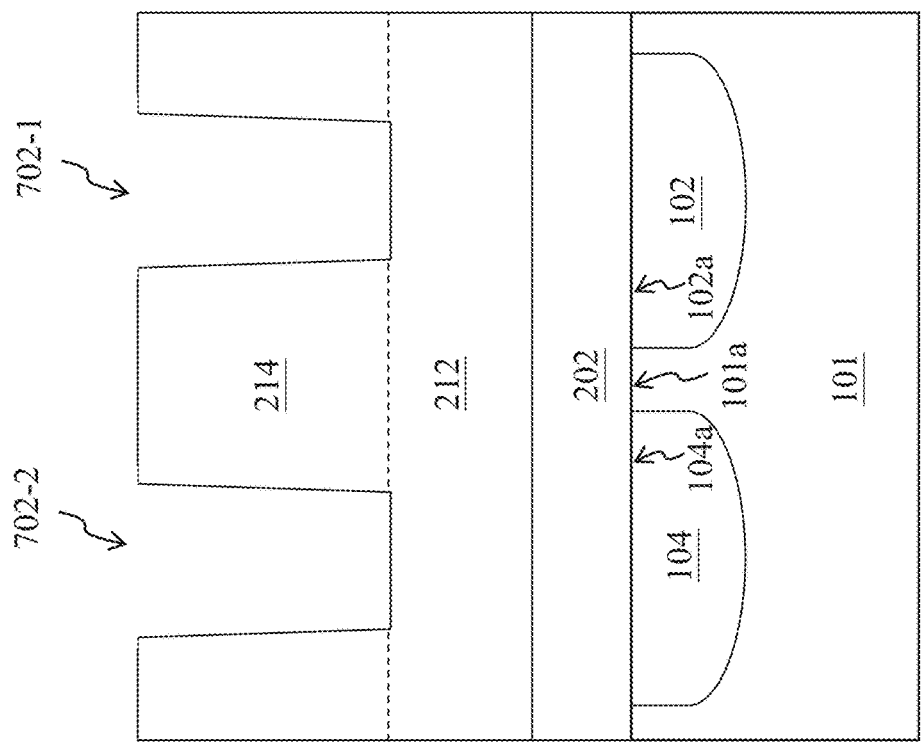
Figure 7B:
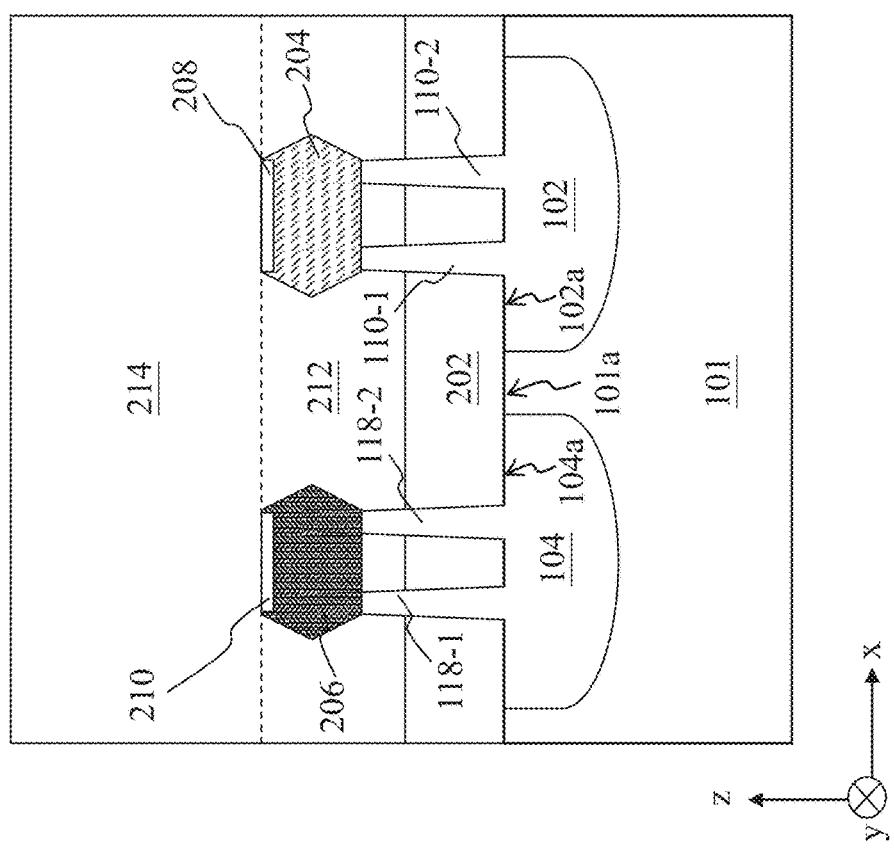
Figure 7C:
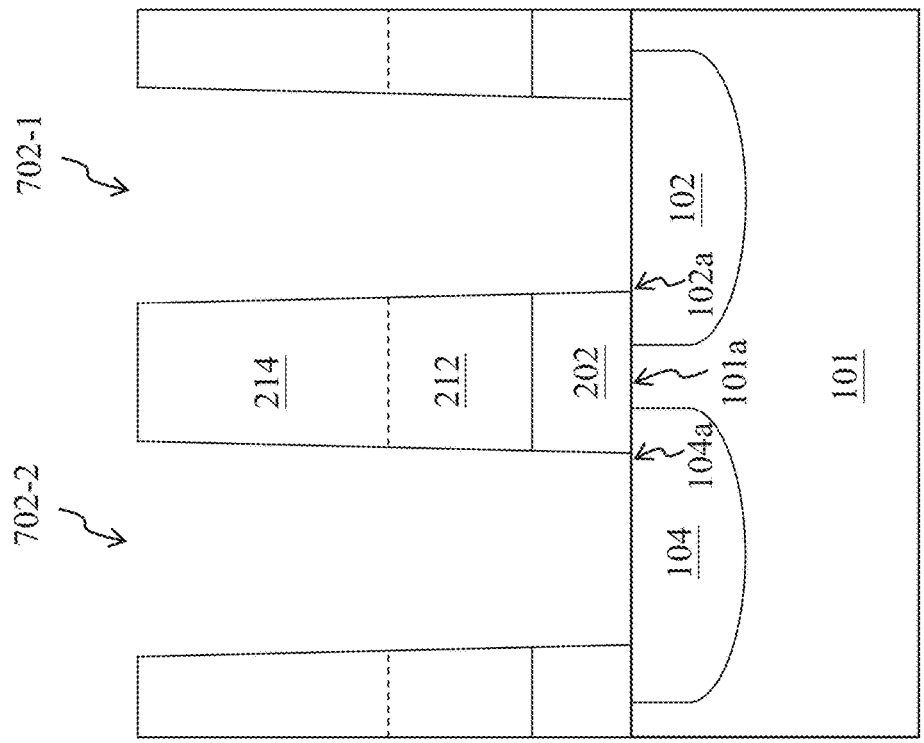
Figure 7C:
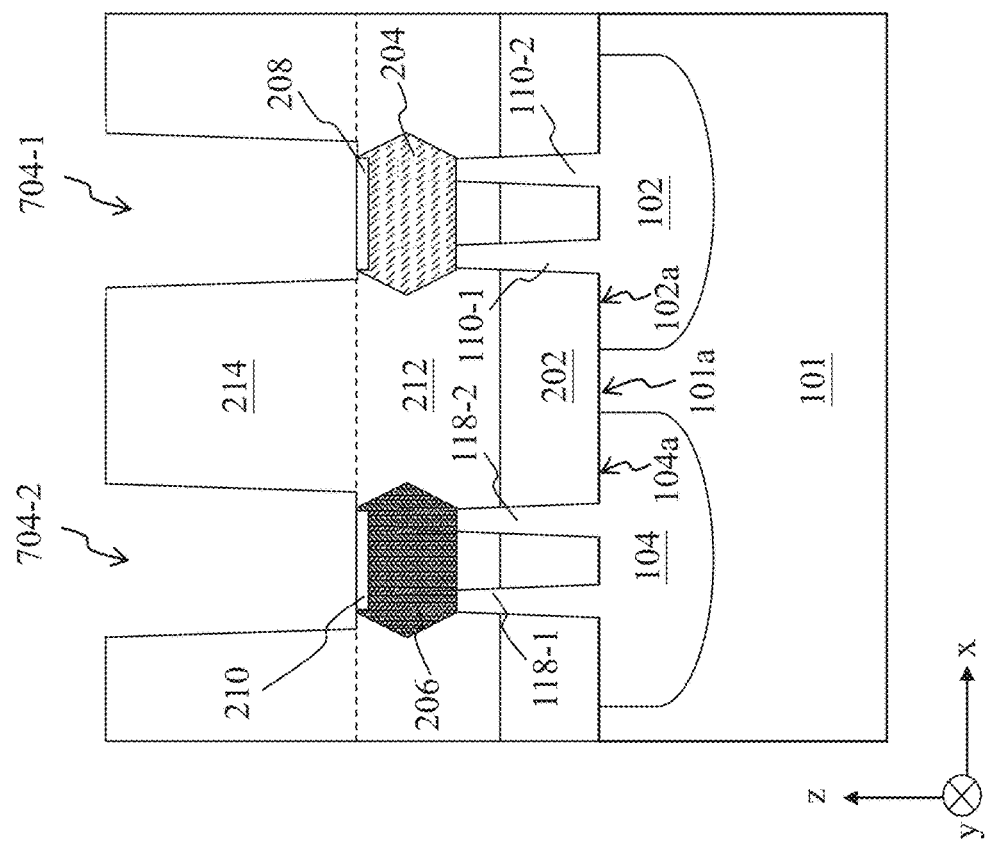

In FIG. 7B, openings 702-1, 702-2 are formed in at least a portion of the second dielectric layer 214 in well pick-up regions 108-1, 108-2. In the embodiment of FIG. 7B, the openings 702-1, 702-2 expose portions of the top surface of the first dielectric layer 212. The process used to form openings 702-1, 702-2 is described above in reference to forming contacts 218-3, 220-3 and vias 222-3, 224-3. In FIG. 7C, a suitable patterning (e.g. lithography process) and etching process is performed to form openings 704-1, 704-2 in the circuit regions 106-1, 106-2 such that at least a portion of a major surface of each of the epitaxial source/drain features 204, 206 is exposed. As an example, the openings 704-1, 704-2 may expose at least a portion of the silicide layers 208, 210 formed on or within the epitaxial source/drain features 204, 206. The etching process also extends the openings 702-1, 702-2 into an entire thickness of each of the first dielectric layer 212 and the isolation layer 202 to expose at least a portion of the major surface 102a of the p-well region 102 and at least a portion of the major surface 104a of the n-well region 104 in the well pick-up regions 108-1, 108-2. Suitable patterning and etching processes include those described above in reference to forming contacts 218-3, 220-3 and vias 222-3, 224-3.

Figure 7D:
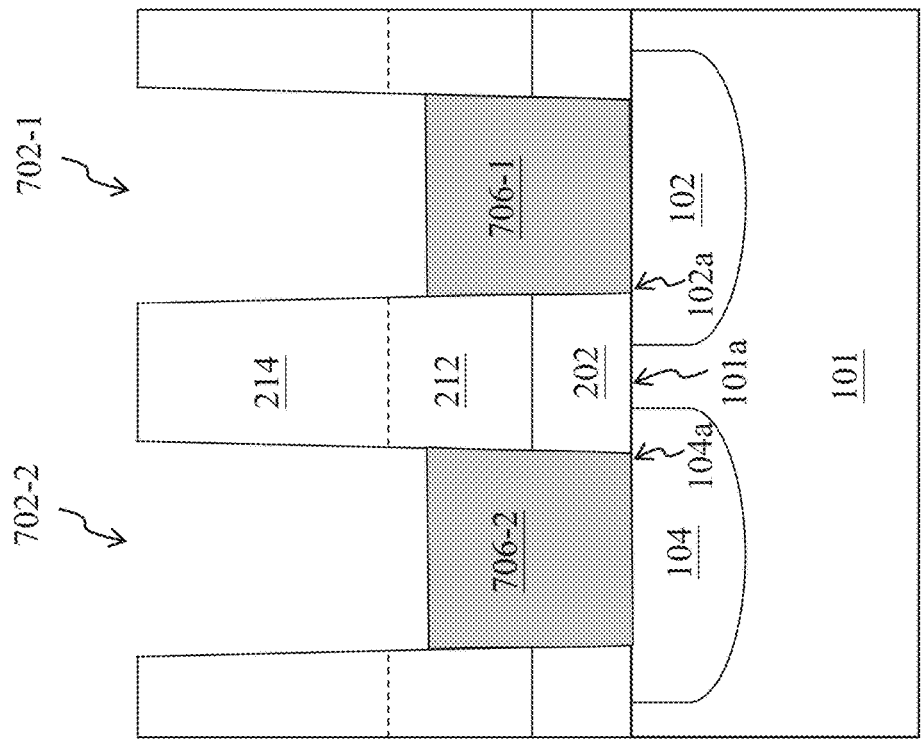
Figure 7D:
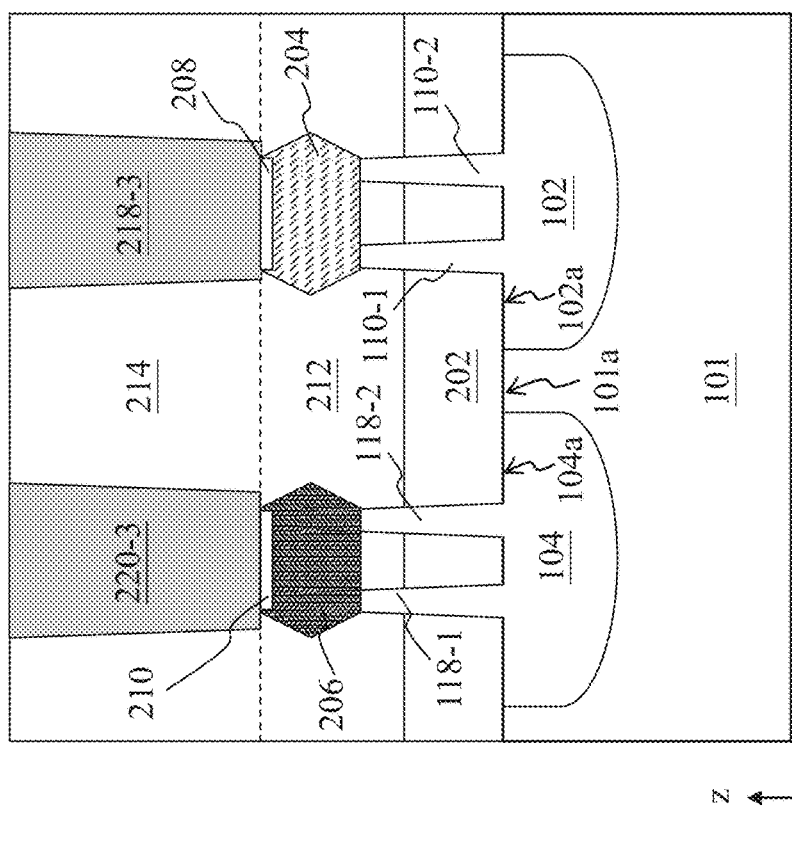

In FIG. 7D, a conductive material (e.g. as described above in reference to contacts 218-3, 220-3) is deposited into openings 704-1, 704-2 to form contacts 218-3, 220-3. Suitable deposition processes have been described in reference to forming contacts 218-3, 220-3 and vias 222-3, 224-3. The deposition process may also partially fill opening 702-1 with conductive material 706-1 and partially fill opening 702-2 with conductive material 706-2. It is noted that the conductive material 706-1 and 706-2 may subsequently form bottom portions of the first conductive plug 226-1 and the second conductive plug 228-1, respectively. In some embodiments, a silicidation process is performed after forming openings 702-1, 702-2 but prior to the deposition of conductive material 706-1, 706-2. Such embodiments may be used when silicide layers 234, 236 are desired in the p-well region 102 and the n-well region 104. The silicide layers 234, 236 may be formed using the processes described above in reference to silicide layers 208, 210.

Figure 7E:
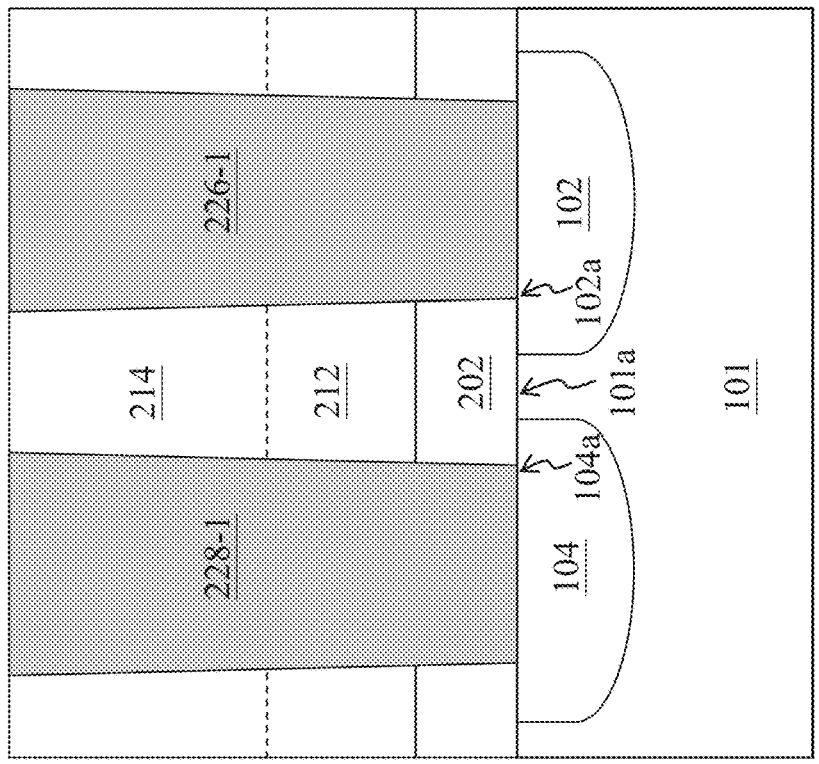
Figure 7E:
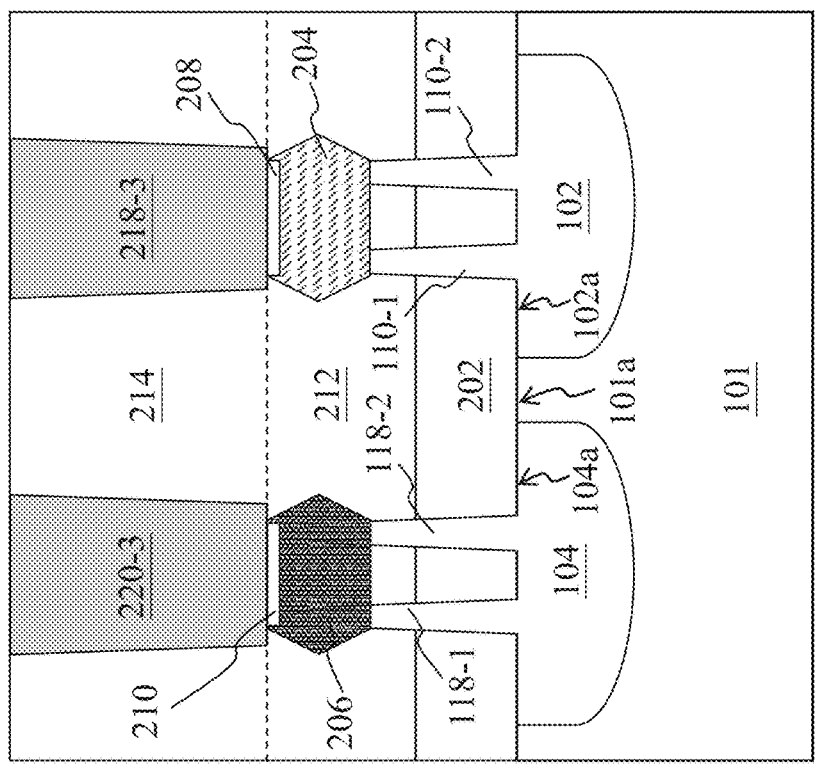
Figure 7F:
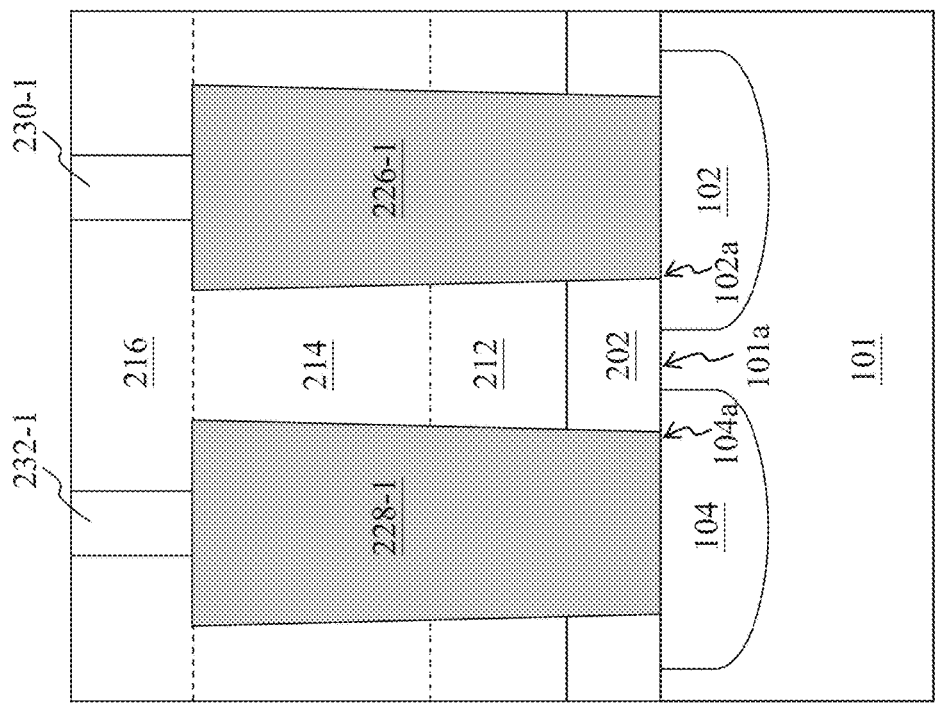
Figure 7F:
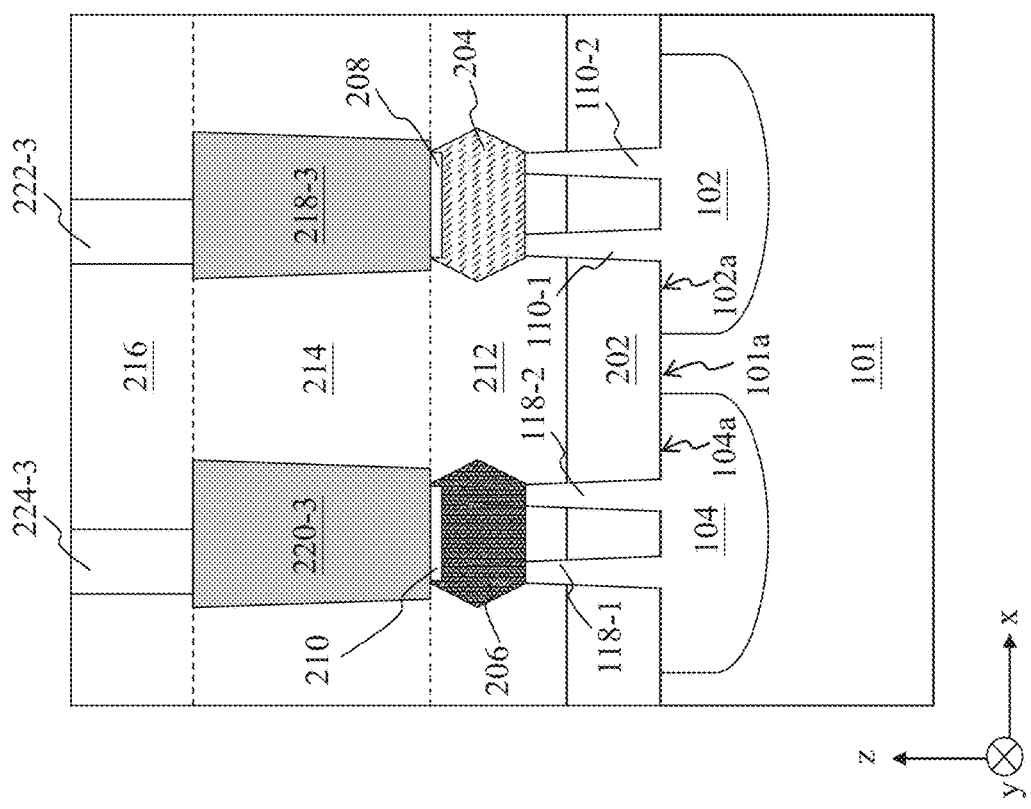

In FIG. 7E, deposition of conductive material into the openings 702-1, 702-2 continues to form the first conductive plug 226-1 and the second conductive plug 228-1. In some embodiments, a planarization process (e.g. a CMP process) may be used to ensure that upward-facing surfaces of the conductive plugs 226-1, 228-1, the contacts 218-3, 220-3, and second dielectric layer 214 are substantially coplanar. In FIG. 7F, the third dielectric layer 216 is formed over the second dielectric layer 214, and vias 222-3 and 224-3 are formed in the third dielectric layer 216 using the process(es) described in the foregoing description. The process used for forming vias 230-1, 232-1 in the well pick-up regions 108-1, 108-2 may be similar to the process used for forming vias 222-3 and 224-3 in the circuit regions 106-1, 106-2.

Figure 8:
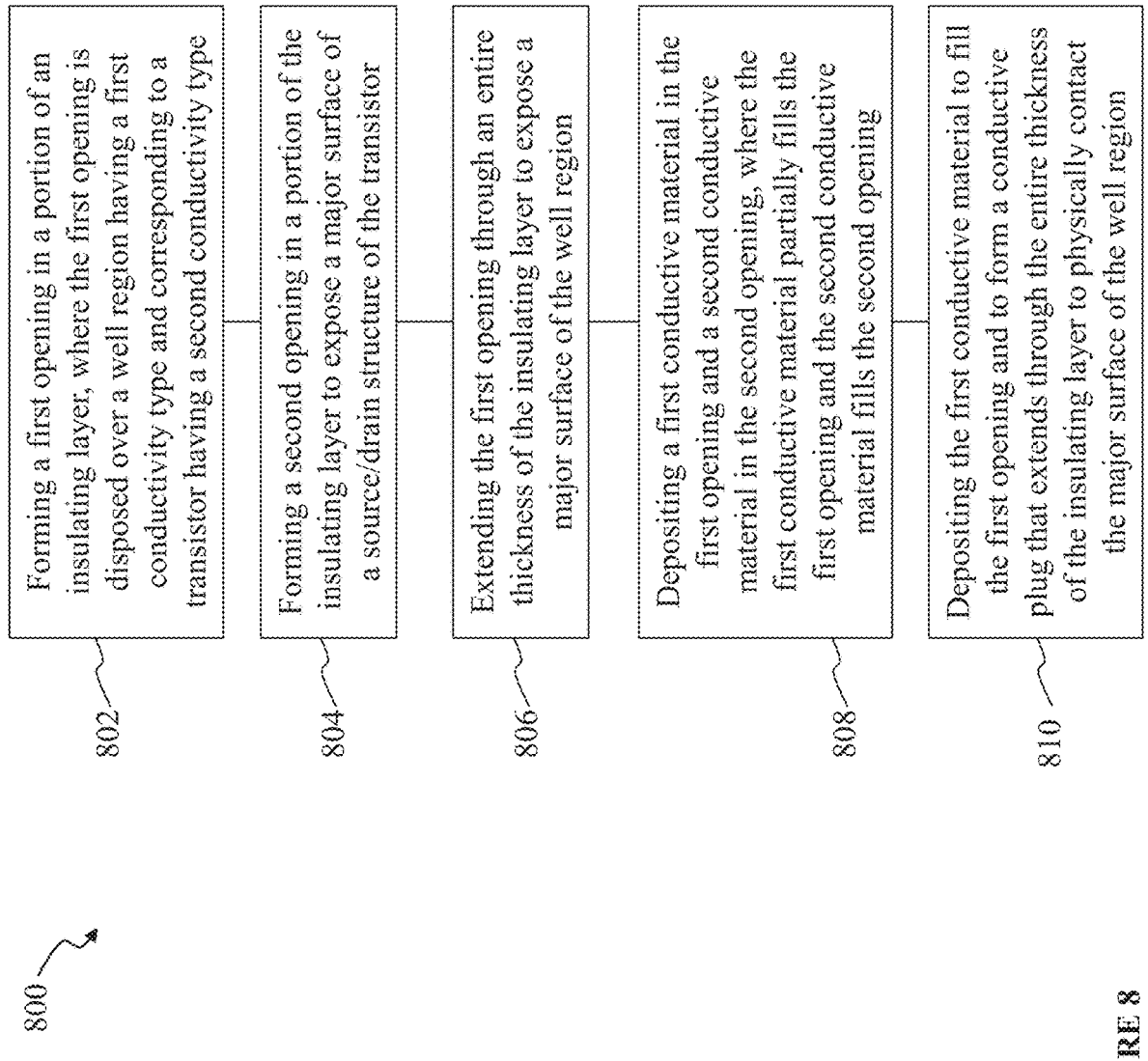
FIGS. 8 and 10 show flow charts describing methods for forming well strap structures configured as described herein, in accordance with various embodiments.

FIG. 8 shows a flow chart illustrating an embodiment method 800 of forming the p-well strap structure 226-1, 230-1 and n-well strap structure 228-1, 232-1 described above. The method 800 may, as an example, correspond to the process flow shown in FIGS. 7A to 7F. Method 800 includes step 802 of forming a first opening in a portion of an insulating layer, where the first opening is disposed over a well region having a first conductivity type and corresponding to a transistor having a second conductivity type. Step 802 may, as an example, correspond to the steps shown in FIGS. 7A and 7B. Method 800 also includes step 804 of forming a second opening in a portion of the insulating layer to expose a major surface of a source/drain structure of the transistor. Step 804 may, as an example, correspond to the step shown in FIG. 7C. Method 800 further includes step 806 of extending the first opening through an entire thickness of the insulating layer to expose a major surface of the well region. Step 806 may, as an example correspond to the step shown in FIG. 7C. Method 800 further includes step 808 of depositing a first conductive material in the first opening and a second conductive material in the second opening, where the first conductive material partially fills the first opening and the second conductive material fills the second opening. Step 808 may, as an example, correspond to the step shown in FIG. 7D. Method 800 additionally includes step 810 of depositing the first conductive material to fill the first opening and to form a conductive plug that extends through the entire thickness of the insulating layer to physically contact the major surface of the well region. Step 808 may, as an example, correspond to the step shown in FIG. 7E.

Figure 9A:
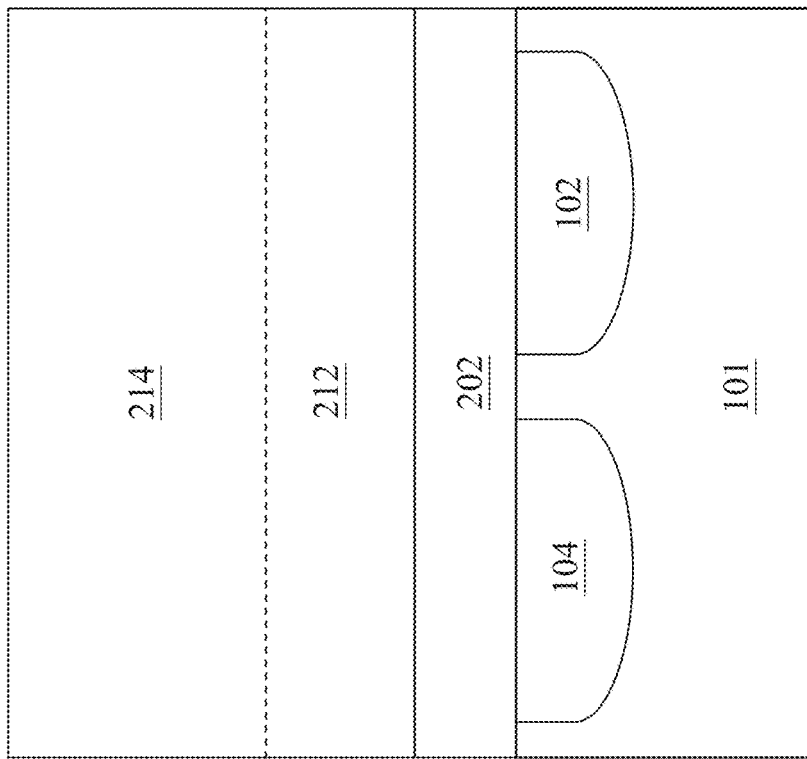
Figure 9A:
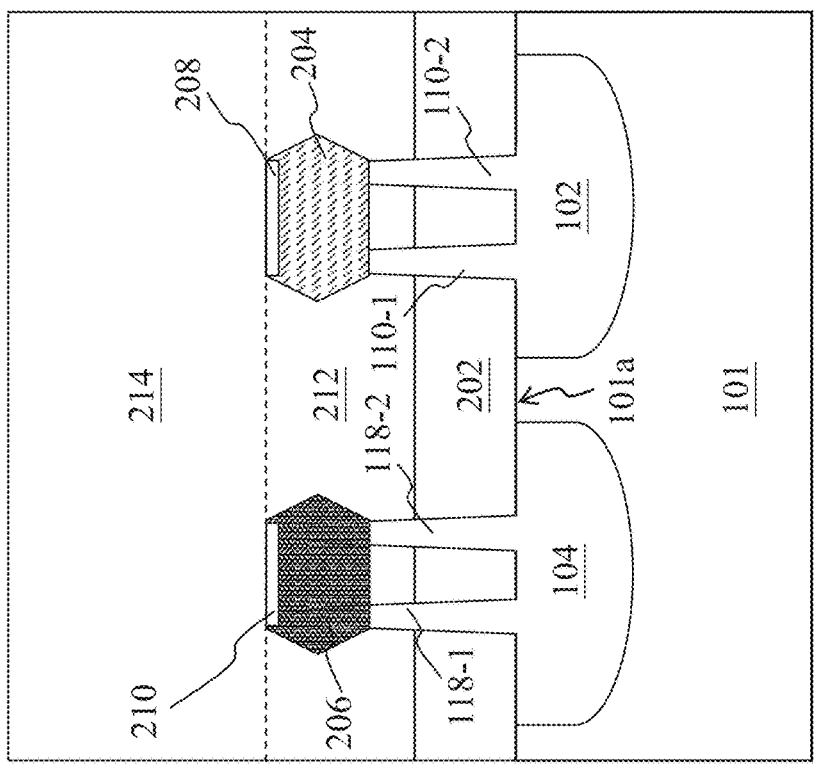
Figure 9B:
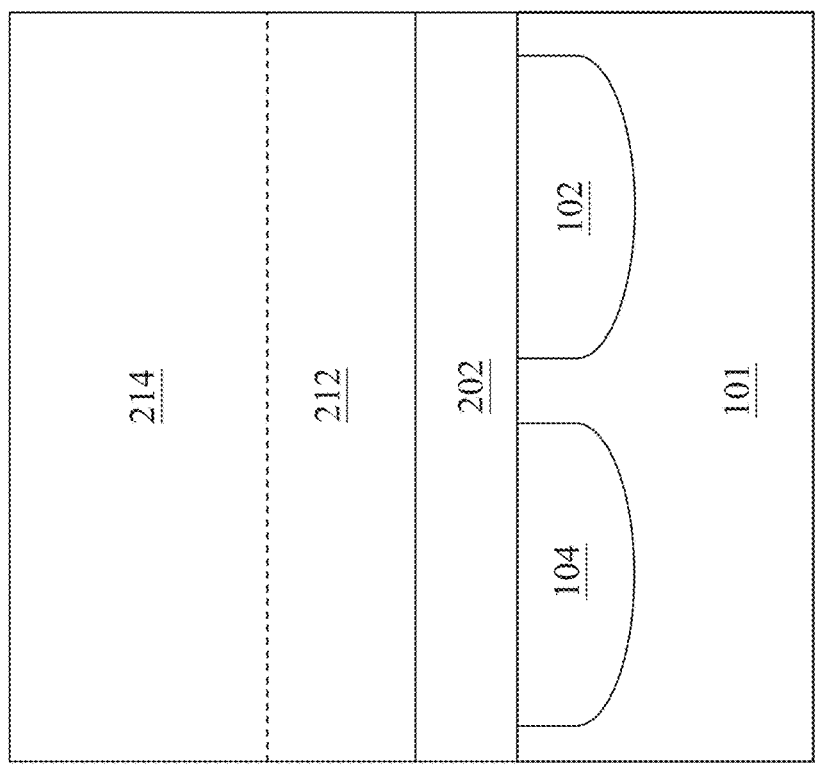
Figure 9B:
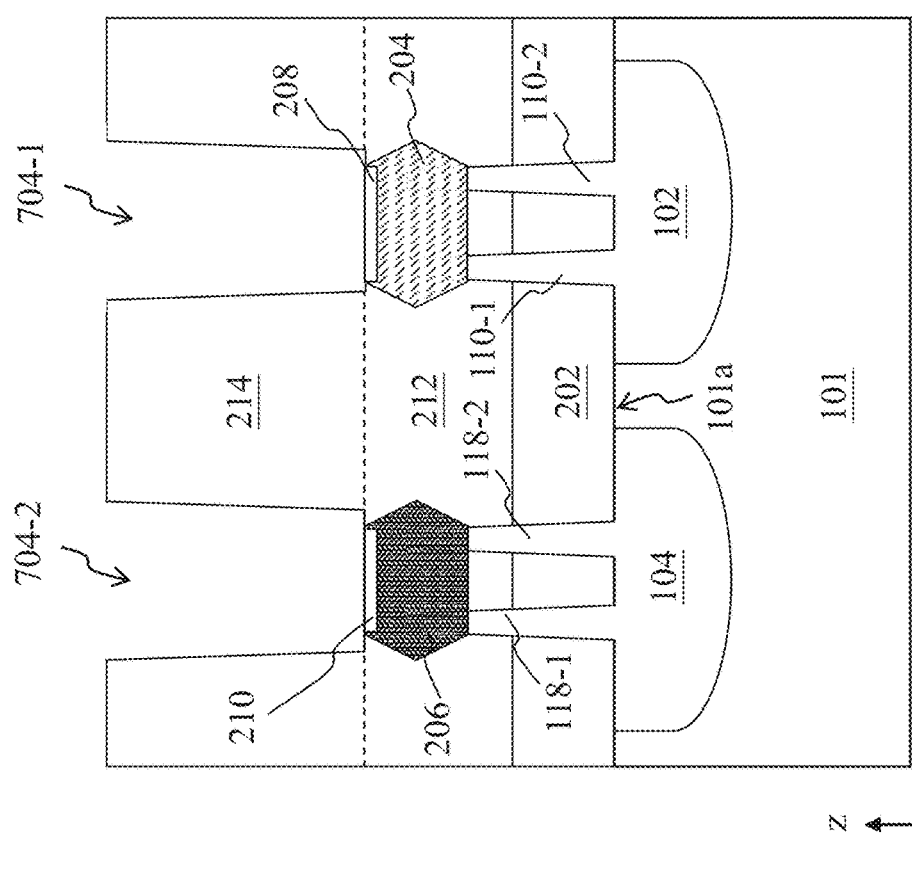
Figure 9C:
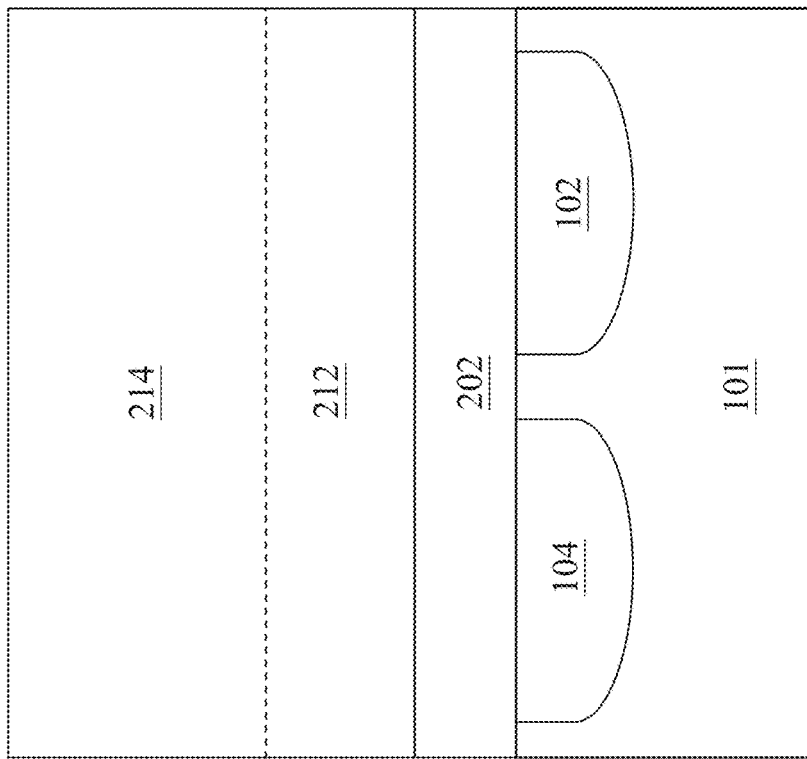
Figure 9C:
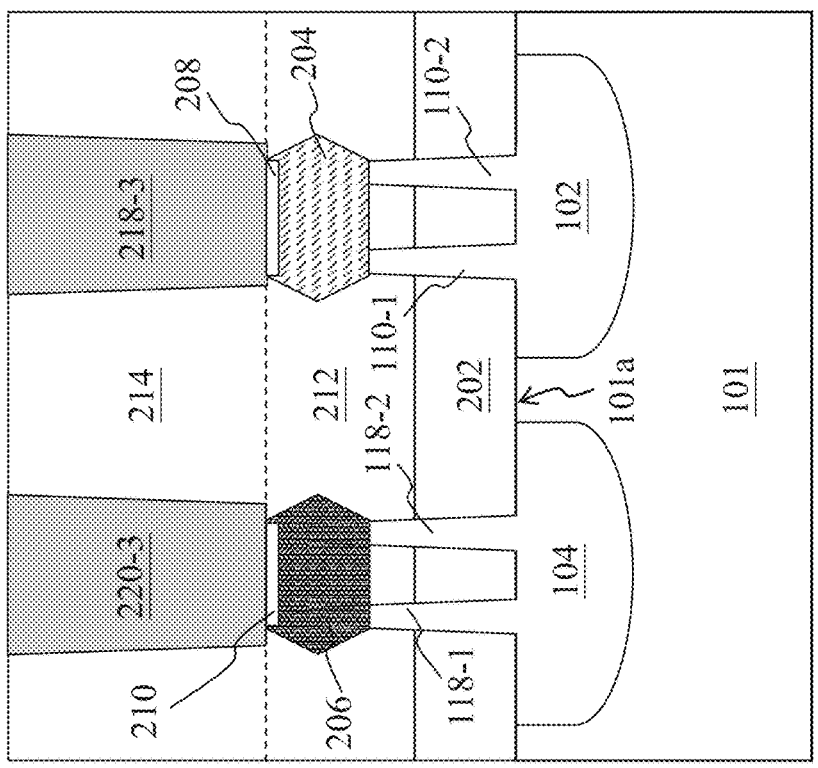
Figure 9D:
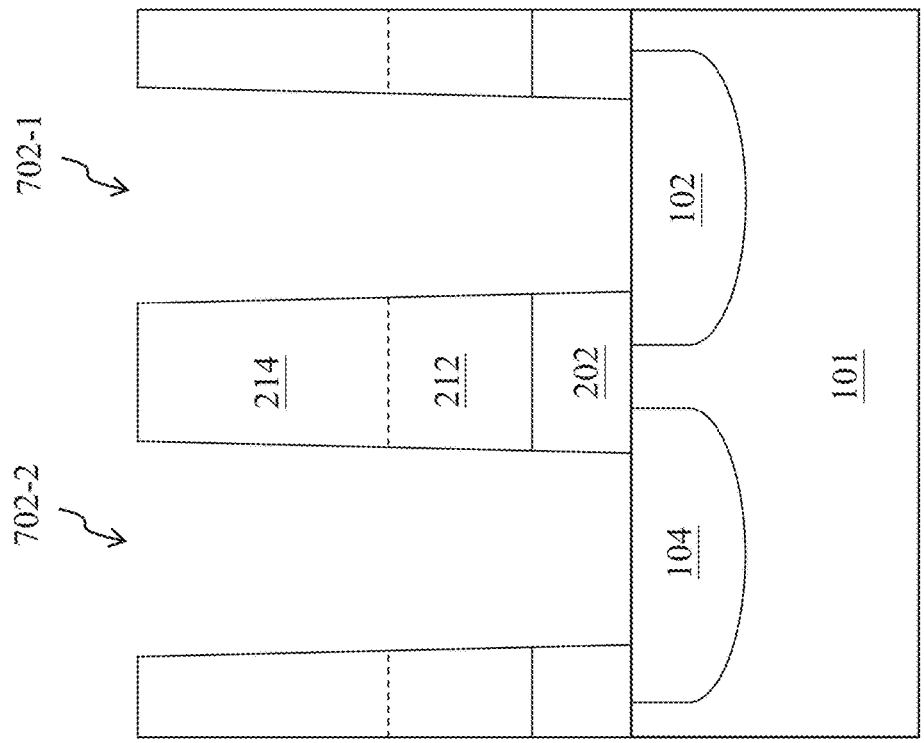
Figure 9D:
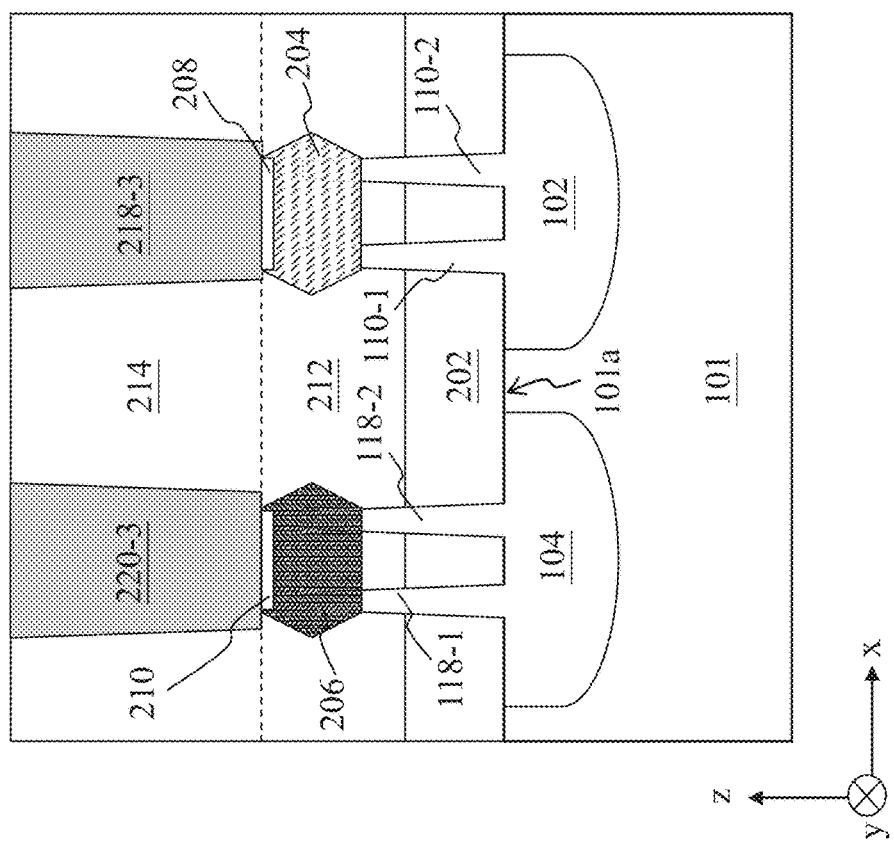
Figure 9E:
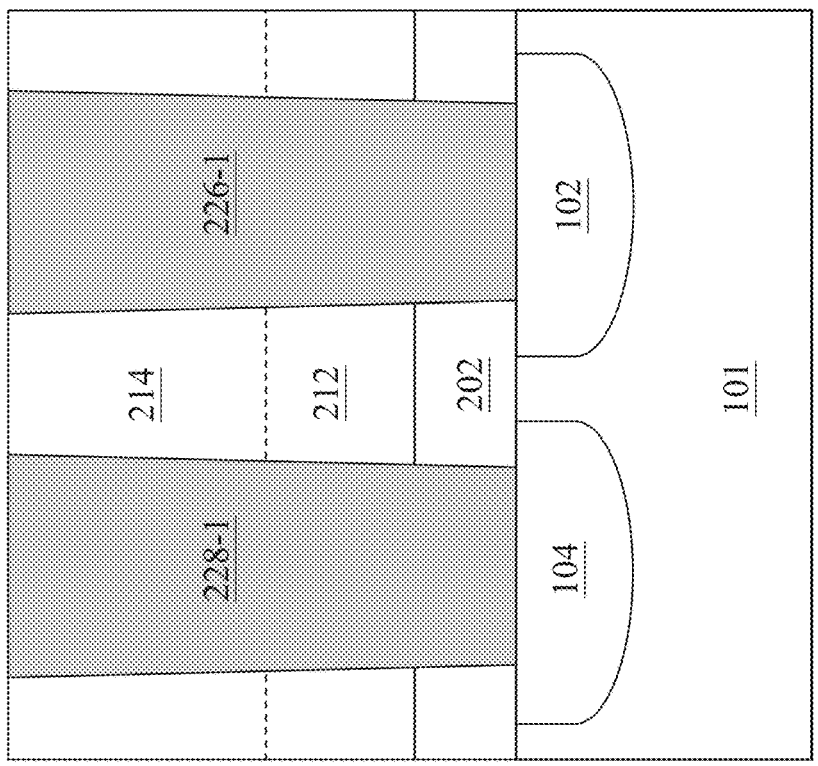
Figure 9E:
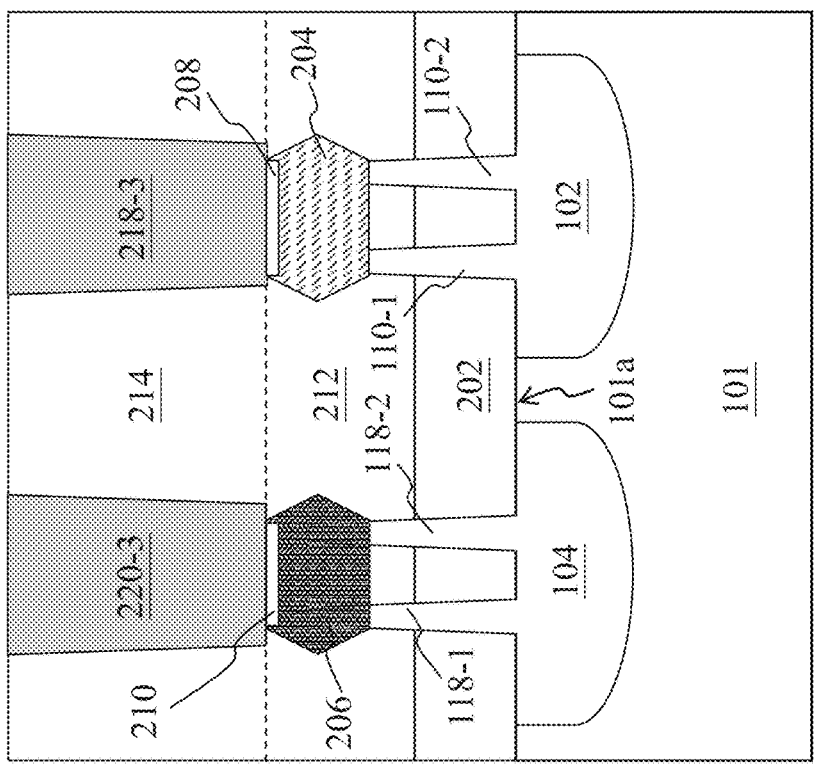
Figure 9F:
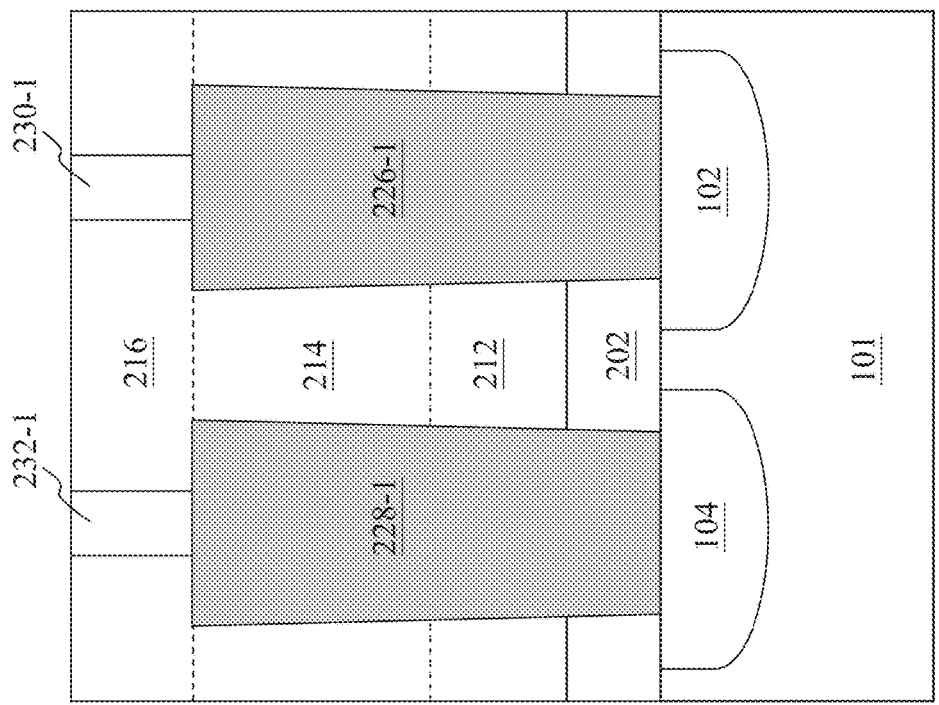
Figure 9F:
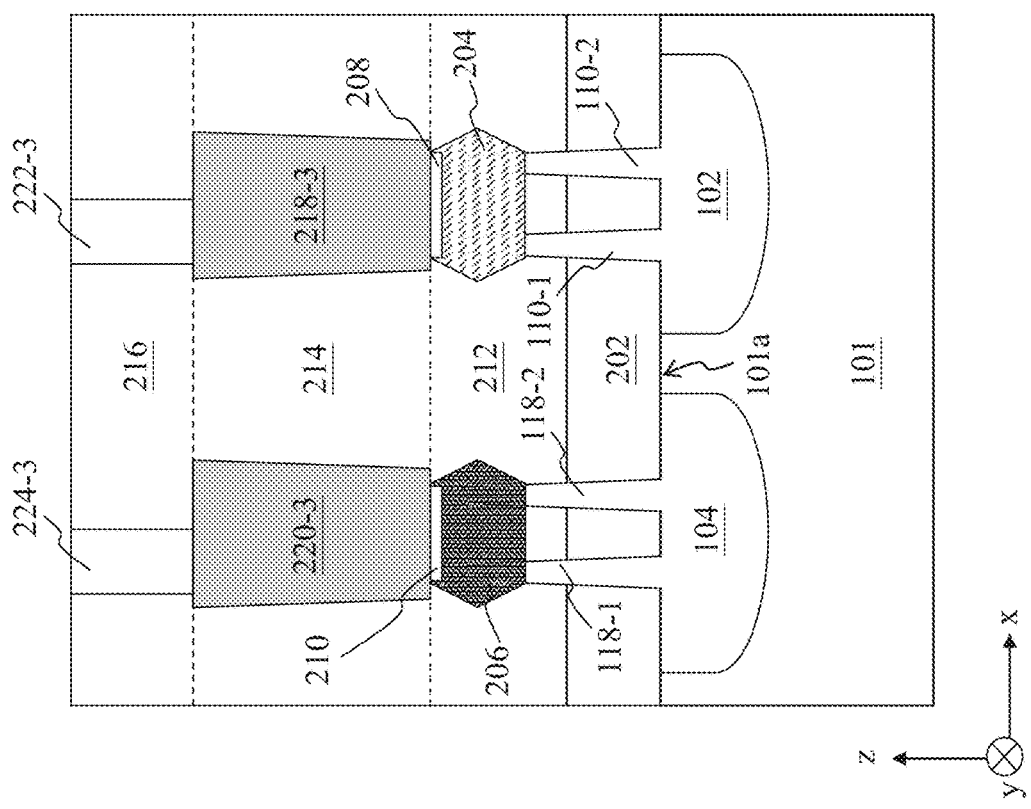

The process shown in FIGS. 7A to 7F illustrates an embodiment where a portion (e.g. bottom portion) of each conductive plug 226-1, 228-1 is formed substantially contemporaneously with the contacts 218-3, 220-3. However, in other embodiments, the conductive plugs 226-1, 228-1 for the p-well strap structure 226-1, 230-1 and n-well strap structure 228-1, 232-1 may be formed separately from (e.g. before or after the formation of) the contacts 218-3, 220-3. For example, FIGS. 9A to 9F show a process flow that may be used to form the p-well strap structure 226-1, 230-1 and n-well strap structure 228-1, 232-1, where the contacts 218-3, 220-3 are formed before forming the conductive plugs 226-1, 228-1. In FIGS. 9A to 9C, the contacts 218-3, 220-3 are formed, e.g. using the processed described above, while the well pick-up regions 108-1, 108-2 are masked and covered. In FIGS. 9D and 9E, the conductive plugs 226-1, 228-1 are formed, e.g. using the processed described above, while the circuit regions 106-1, 106-2 are masked and covered. Subsequently, the mask that is covering the circuit regions 106-1, 106-2 is removed to form the vias 222-3, 224-3 in the circuit regions 106-1, 106-2 and the vias 230-1, 232-1 in the well pick-up regions 108-1, 108-2.

Figure 10:
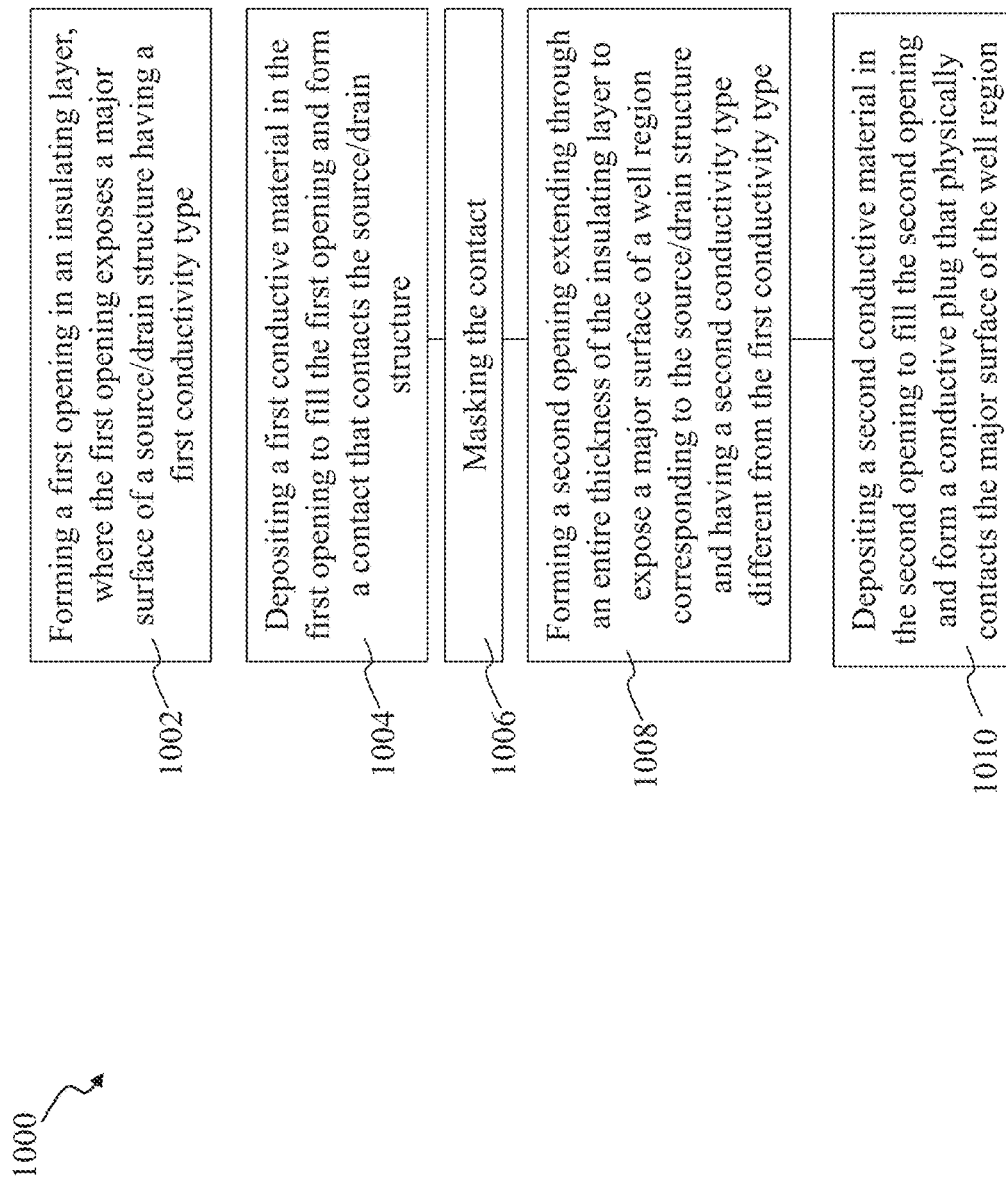

FIG. 10 shows a flow chart illustrating an embodiment method 1000 of forming the p-well strap structure 226-1, 230-1 and n-well strap structure 228-1, 232-1 described above. The method 1000 may, as an example, correspond to the process flow shown in FIGS. 9A to 9F. Method 1000 includes step 1002 of forming a first opening in an insulating layer, where the first opening exposes a surface of a source/drain structure having a first conductivity type. Step 1002 may, as an example, correspond to the steps shown in FIGS. 9A and 9B.

Method 1000 also includes step 1004 of depositing a first conductive material in the first opening to fill the first opening and form a contact that contacts the source/drain structure. Step 1004 may, as an example, correspond to the step shown in FIG. 9C. Method 1000 further includes step 1006 of masking the contact and step 1008 of forming a second opening extending through an entire thickness of the insulating layer to expose a major surface of a well region corresponding to the source/drain structure and having a second conductivity type different from the first conductivity type. Steps 1006 and 1008 may, as an example, correspond to the steps shown in FIG. 9D. Method 1000 additionally includes step 1010 of depositing a second conductive material in the second opening to fill the second opening and form a conductive plug that physically contacts the major surface of the well region. Step 1010 may, as an example, correspond to the step shown in FIG. 9E.

Figure 11:
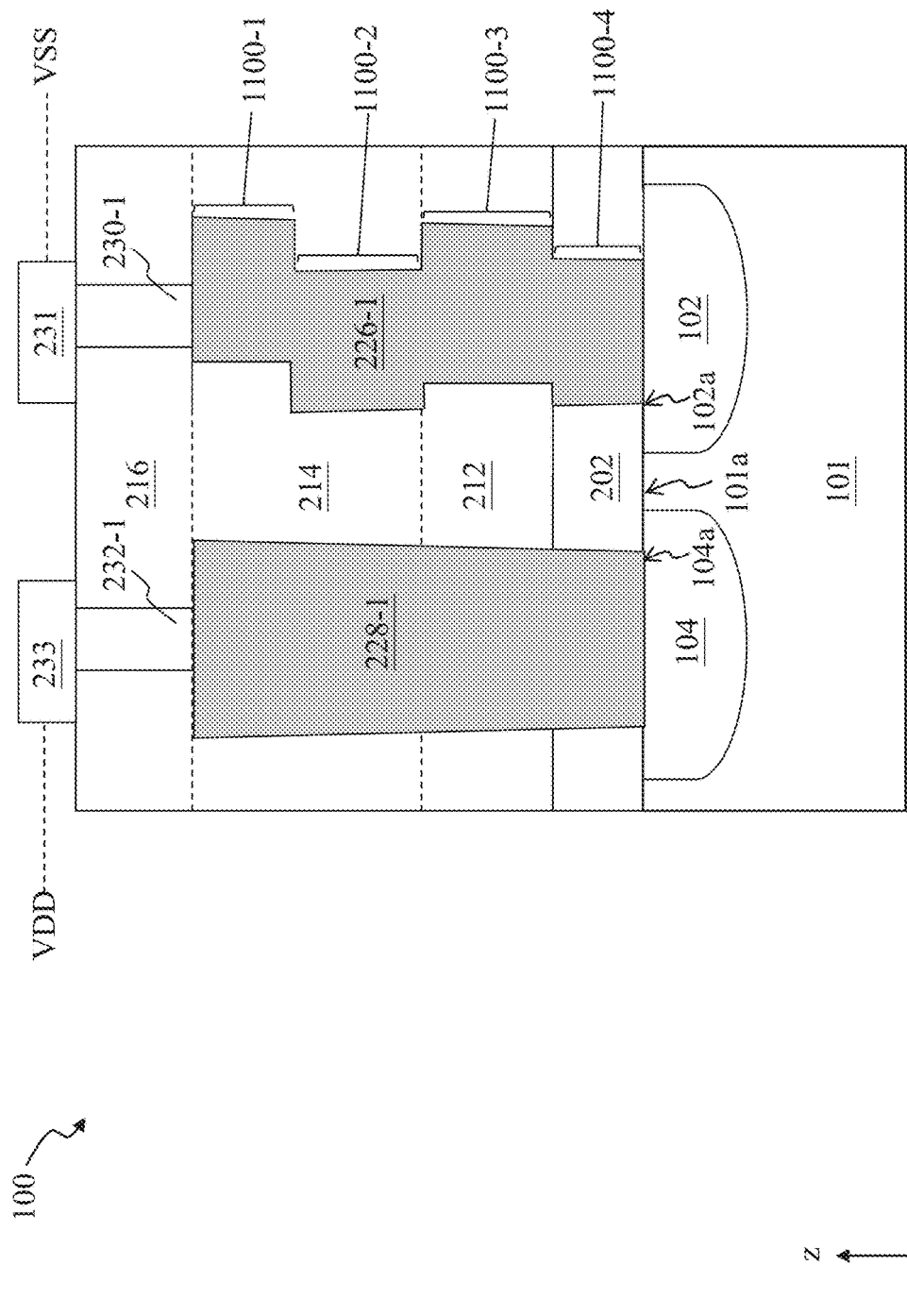
FIG. 11 shows simplified cross-sectional view of well strap structures, in accordance with another embodiment.

In the examples discussed above, the first conductive plug 226-1 and the second conductive plug 228-1 are depicted as being continuous plugs having sidewalls that extend linearly or continuously from a top surface of a respective plug to a bottom surface of the respective plug. However, other embodiments are possible, such as an embodiment where the first conductive plug 226-1 or the second conductive plug 228-1 includes sidewalls having a stepped-like structure. For example, the embodiment of FIG. 11 shows the first conductive plug 226-1 having a plurality of segments 1100-1 to 1100-4. Adjacent segments are offset from each other in a lateral direction (e.g. the x-direction). As a result of the offset, the sidewalls of the first conductive plug 226-1 no longer extend linearly or continuously from a top surface thereof to a bottom surface thereof. Rather, the offset segments cause the sidewalls of the first conductive plug 226-1 to have a stepped-like structure. However, even in the embodiment of FIG. 11, the first conductive plug 226-1 makes physical contact with the major surface 102a of the well region 102 without the use of an intervening semiconductor structure (e.g. a fin) that extends from the major surface 102a of the well region 102, thereby providing the embodiment of FIG. 11 similar advantages as those discussed above in reference to other embodiments.

In summary, the present disclosure proposes well straps that have reduced well pick-up resistance, that achieve significant improvements in latch-up performance, and that efficiently use chip real estate. For example, this disclosure proposes using a conductive plug (e.g. a metal plug) that continuously extends through an inter-layer dielectric (ILD) layer and a shallow trench isolation (STI) layer to physically contact a major surface of well region so that contact area is increased, well pick-up resistance is reduced, and latch-up immunity is improved (e.g. in a logic circuit or a memory array including the proposed well strap). Contact between the conductive plug and the major surface of the well region is made without the use of an intervening semiconductor structure (e.g. a fin) that extends from the major surface of the well region. In some embodiments, a silicide layer is formed in the well region and the conductive plug directly and physically contacts the silicide layer formed in the well region. Additionally, since contact between the conductive plug and the well region is made without the use of an intervening semiconductor structure (e.g. a fin) that extends from the major surface of the well region, no anti-type source/drain masking step is required for doping a well pick-up region. Furthermore, since contact between the conductive plug and the well region is made without the use of an intervening semiconductor structure (e.g. a fin) that extends from the major surface of the well region, a well pick-up region can be separated from a circuit region by a single dummy gate (e.g. dielectric dummy gate) having a width substantially equal to a channel length (e.g. 2 nanometers to 30 nanometers). This obviates the need for a substantial dummy region/area between a circuit region and a well pick-up region, which, in turn, results in a more efficient use of chip area. The proposed well strap may be used in conjunction with fin-based logic circuit or memory cells or GAA-based logic circuits or memory cells. Furthermore, the proposed well strap does not affect desired characteristics of non-planar transistors used in the memory cells (e.g. voltage threshold in a FinFET used in a memory cells). Different embodiments may have different advantages, and no particular advantage is necessarily required of any embodiment.

An embodiment integrated circuit structure includes a well region having a first conductivity type; a semiconductor structure, having the first conductivity type, extending away from the well region from a major surface of the well region; and a source/drain feature, having a second conductivity type different from the first conductivity type, disposed on the semiconductor structure. The embodiment integrated circuit structure further includes an isolation layer laterally surrounding at least a portion of the semiconductor structure; a dielectric layer disposed on the isolation layer, wherein at least a portion of the source/drain feature is disposed in the dielectric layer; and a conductive plug continuously extending through the dielectric layer and the isolation layer to physically contact the major surface of the well region, wherein the conductive plug is coupled to a power supply line to bias the well region.

An embodiment integrated circuit structure includes a substrate; a p-type well region formed in the substrate; an n-type well region formed in the substrate; an isolation layer disposed on the substrate; and a dielectric layer disposed on the isolation layer. The p-type well region includes: a p-type semiconductor structure extending from a major surface of the p-type well region; an n-type source/drain region disposed on the p-type semiconductor structure; and a first contact disposed on a surface of the n-type source/drain region directed away from the major surface of the p-type well region. The n-type well region includes: an n-type semiconductor structure extending from a major surface of the n-type well region; a p-type source/drain region disposed on the n-type semiconductor structure; and a second contact disposed on a surface of the p-type source/drain region directed away from the major surface of the n-type well region. At least a portion of the p-type semiconductor structure and at least a portion of the n-type semiconductor structure are disposed in the isolation layer, and at least a portion of the n-type source/drain region and at least a portion of the p-type source/drain region are disposed in the dielectric layer. The embodiment integrated circuit structure further includes: a first plug element extending through an entire thickness of each of the dielectric layer and the isolation layer to physically contact the major surface of the p-type well region; and a second plug element extending through the entire thickness of each of the dielectric layer and the isolation layer to physically contact the major surface of the n-type well region.

An embodiment method includes: forming a first opening in a first portion of an insulating layer, wherein the first opening is disposed over a well region having a first conductivity type, the well region corresponding to a transistor having a second conductivity type; forming a second opening in a second portion of the insulating layer to expose a major surface of a source/drain structure of the transistor, the source/drain structure being disposed on a fin having the first conductivity type, the fin extending away from the well region from a major surface of the well region; extending the first opening through an entire thickness of the insulating layer to expose at least a portion of the major surface of the well region; and depositing a first conductive material in the first opening to form a conductive plug that extends through the entire thickness of the insulating layer and physically contacts the major surface of the well region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a well region having a first conductivity type, wherein the well region includes a circuit region and a pick-up region, the circuit region being adjacent to the pick-up region in a first direction;
   a semiconductor structure extending from a major surface of the well region, the semiconductor structure being located in the circuit region and having the first conductivity type;
   a source/drain feature disposed on the semiconductor structure, the source/drain feature having a second conductivity type different from the first conductivity type;
   an isolation layer laterally surrounding at least a portion of the semiconductor structure;
   a dielectric layer disposed on the isolation layer, wherein at least a portion of the source/drain feature is disposed in the dielectric layer;
   a conductive plug extending continuously through the dielectric layer and the isolation layer to physically contact the major surface of the well region, wherein the conductive plug is coupled to a power supply line to bias the well region, and wherein the conductive plug is located in the pick-up region; and
   a dummy gate structure extending longitudinally in a second direction generally perpendicular to the first direction, the dummy gate structure electrically isolating the circuit region from the pick-up region.

2. The integrated circuit structure of claim 1, further comprising an etch stop layer interposed between the isolation layer and the dielectric layer, the etch stop layer having a composition that is different from the isolation layer and the dielectric layer.

3. The integrated circuit structure of claim 1, wherein a bottom surface of the isolation layer is overlapped with and directly contacts the major surface of the well region.

4. The integrated circuit structure of claim 1, wherein the conductive plug comprises a metal material continuously extending from a top surface of the dielectric layer to a bottom surface of the isolation layer to physically contact the major surface of the well region.

5. The integrated circuit structure of claim 1, wherein at least a portion of the semiconductor structure is disposed in the isolation layer.

6. The integrated circuit structure of claim 5, wherein at least a portion of the semiconductor structure is disposed in the dielectric layer.

7. The integrated circuit structure of claim 1, wherein the isolation layer comprises a shallow trench isolation layer of the integrated circuit structure.

8. The integrated circuit structure of claim 1, wherein the semiconductor structure extends longitudinally in the first direction.

9. The integrated circuit structure of claim 1, wherein the semiconductor structure comprises a fin structure extending out of the well region from the major surface of the well region.

10. The integrated circuit structure of claim 1, further comprising a contact extending through a portion of the dielectric layer to contact the source/drain feature.

11. The integrated circuit structure of claim 1, further comprising a silicided feature at the major surface of the well region, wherein the conductive plug physically contacts the silicided feature.

12. The integrated circuit structure of claim 1, wherein the conductive plug comprises at least one metal selected from a group consisting of Ti, TiN, Ni, Mo, Pt, Co, Ru, W, TaN, and Cu.

13. An integrated circuit structure, comprising:
    a substrate;
    a well region formed in the substrate and having a first conductivity type dopant, the well region comprising:
       a semiconductor structure having the first conductivity type and extending from a major surface of the well region;
       a source/drain region having a second conductivity type and disposed on the semiconductor structure, the second conductivity type being opposite to the first conductivity type; and
       a first contact disposed on a surface of the source/drain region directed away from the major surface of the well region;
    an isolation layer of a dielectric material disposed on the substrate, wherein a bottom surface of the isolation layer is overlapped with and directly contacts the major surface of the well region, and wherein at least a portion of the semiconductor structure is disposed in the isolation layer;

a dielectric layer disposed on the isolation layer, wherein at least a portion of the source/drain region is disposed in the dielectric layer; and a first plug element extending through an entire thickness of each of the dielectric layer and the isolation layer to physically contact the major surface of the well region.

14. The integrated circuit structure of claim 13, wherein the first plug element is coupled to a first power supply line that biases the well region at a first bias potential, and wherein the first bias potential comprises a ground potential.

15. The integrated circuit structure of claim 13, wherein the well region is a first well region, and the source/drain region is a first source/drain region, and wherein the integrated circuit structure further includes a second well region formed in the substrate and having the second conductivity type, the second well region comprising:

a second semiconductor structure having the second conductivity type and extending from a major surface of the second well region;

a second source/drain region having the first conductivity type and disposed on the second semiconductor structure; and a second contact disposed on a surface of the second source/drain region directed away from the major surface of the second well region, wherein the bottom surface of the isolation layer is overlapped with and directly contacts the major surface of the second well region, and wherein at least a portion of the second semiconductor structure is disposed in the isolation layer, and wherein at least a portion of the second source/drain region is disposed in the dielectric layer; and a second plug element extending through an entire thickness of each of the dielectric layer and the isolation layer to physically contact the major surface of the second well region.

16. The integrated circuit structure of claim 15, wherein the second plug element is coupled to a second power supply line that biases the second well region at a second bias potential, and wherein the second bias potential comprises a positive supply potential.

17. The integrated circuit structure of claim 16, further comprising an etch stop layer interposed between the isolation layer and the dielectric layer, the etch stop layer having a composition that is different from the isolation layer and the dielectric layer.

18. A method, comprising:

forming an insulating layer on a semiconductor substrate;

performing a patterning process to the insulating layer to form an opening, wherein the opening extends through an entire thickness of the insulating layer to expose at least a portion of a major surface of the well region; and depositing a first conductive material in the opening to form a conductive plug that extends through the entire thickness of the insulating layer and physically contacts the major surface of the well region.

19. The method of claim 18, wherein the performing a patterning process further includes:

performing a first patterning process to the insulating layer to form a first opening, wherein the first opening is disposed over the well region having a first conductivity type, the well region corresponding to a transistor having a second conductivity type; and performing a second patterning process to the insulating layer, thereby exposing a major surface of a source/drain structure of the transistor and extending the first opening through an entire thickness of the insulating layer to expose at least a portion of the major surface of the well region, wherein the source/drain structure is disposed on a fin having the first conductivity type, and wherein the fin extends away from the well region from the major surface of the well region.

20. The method of claim 19, wherein forming the insulating layer comprises:

depositing a shallow trench isolation layer on the major surface of the well region, wherein the shallow trench isolation layer laterally surrounds a bottom portion of the fin; and depositing an inter-layer dielectric layer on the shallow trench isolation layer, wherein the inter-layer dielectric layer laterally surrounds a top portion of the fin.

* * * * *